(12) United States Patent
Kasahara et al.

(10) Patent No.: US 9,329,474 B2
(45) Date of Patent: May 3, 2016

(54) PHOTORESIST COMPOSITION AND RESIST PATTERN-FORMING METHOD

(71) Applicant: JSR CORPORATION, Tokyo (JP)

(72) Inventors: Kazuki Kasahara, Tokyo (JP); Norihiko Ikeda, Tokyo (JP)

(73) Assignee: JSR CORPORATION, Tokyo (JP)

( * ) Notice: Subject to any disclaimer, the term of this patent is extended or adjusted under 35 U.S.C. 154(b) by 79 days.

(21) Appl. No.: 13/852,147

(22) Filed: Mar. 28, 2013

(65) Prior Publication Data

US 2013/0280657 A1 Oct. 24, 2013

(30) Foreign Application Priority Data

Apr. 2, 2012 (JP) .................. 2012-084391

(51) Int. Cl.
G03F 7/004 (2006.01)
G03F 7/027 (2006.01)
G03F 7/20 (2006.01)
G03F 7/039 (2006.01)

(52) U.S. Cl.
CPC .............. *G03F 7/004* (2013.01); *G03F 7/0045* (2013.01); *G03F 7/0046* (2013.01); *G03F 7/027* (2013.01); *G03F 7/0397* (2013.01); *G03F 7/20* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 4,491,628 A | 1/1985 | Ito et al. | |
| 2002/0042016 A1* | 4/2002 | Yoon et al. ............... | 430/270.1 |
| 2002/0155379 A1* | 10/2002 | Yoon et al. ............... | 430/270.1 |
| 2003/0224285 A1* | 12/2003 | Nakao et al. ............. | 430/270.1 |
| 2004/0072097 A1* | 4/2004 | Kodama .................... | 430/270.1 |
| 2009/0246695 A1* | 10/2009 | Yamaguchi et al. ....... | 430/286.1 |

FOREIGN PATENT DOCUMENTS

| | | | |
|---|---|---|---|
| EP | 0159428 | | 10/1985 |
| JP | 59-45439 | | 3/1984 |
| JP | 6-12452 B2 | | 5/1984 |
| JP | 59-93448 | | 5/1984 |
| JP | 2002-82441 | | 3/2002 |
| JP | 2002-308937 | | 10/2002 |
| JP | 2003107709 A | * | 4/2003 |
| JP | 2003122012 A | * | 4/2003 |
| JP | 2003-195504 A | | 7/2003 |
| JP | 2006-047533 A | | 2/2006 |
| JP | 2006-091073 A | | 4/2006 |
| JP | 2006-258925 A | | 9/2006 |
| JP | 2007-304528 A | | 11/2007 |
| JP | 2009093011 A | * | 4/2009 |
| JP | 2009-244859 A | | 10/2009 |
| JP | 2011-221513 A | | 11/2011 |
| JP | 2012-032806 A | | 2/2012 |
| WO | WO 2012133352 A1 | * | 10/2012 |
| WO | WO 2012157352 A1 | * | 11/2012 |

OTHER PUBLICATIONS

Machine translation JP 2003-107709 Apr. 9, 2003.*
Machine translation JP 2003-122012 Apr. 25, 2003.*
Machine translation WO 2012/157352 Nov. 11, 2012.*
Machine translation WO 2012/133352 Oct. 4, 2012.*
Machine translation JP 2009-093011. Apr. 30, 2009.*
Office Action issued Sep. 8, 2015, in Japanese Patent Application No. 2012-084391 (w/ English translation).
Office Action issued Mar. 1, 2016, in Japanese Patent Application No. 2012-084391 (w/ English translation).

* cited by examiner

*Primary Examiner* — Cynthia H Kelly
*Assistant Examiner* — Alyssa L Cepluch
(74) *Attorney, Agent, or Firm* — Oblon, McClelland, Maier & Neustadt, L.L.P.

(57) ABSTRACT

A photoresist composition includes a polymer component that includes a first structural unit represented by the formula (1) and a second structural unit represented by the formula (2), an acid generator, and a compound represented by the formula (3). The first structural unit and the second structural unit are included in an identical polymer, or different polymers. $R^1$ is hydrogen atom, fluorine atom, etc., $R^2$ and $R^3$ are independently hydrogen atom, fluorine atom, etc., a is an integer from 1 to 6, $R^4$ and $R^5$ independently hydrogen atom, fluorine atom, etc., $R^6$ is hydrogen atom, fluorine atom, etc., $R^7$ and $R^8$ are each independently alkyl group having 1 to 4 carbon atoms, etc., $R^9$ is alkyl group having 1 to 4 carbon atoms, etc., $R^{10}$ is hydrogen atom, etc., $A^-$ is $-N^--SO_2-R^a$, etc., and $X^+$ is onium cation.

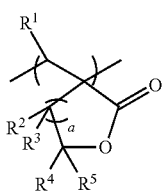

(1)

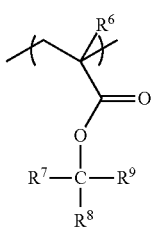

(2)

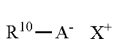

(3)

15 Claims, No Drawings

PHOTORESIST COMPOSITION AND RESIST PATTERN-FORMING METHOD

CROSS-REFERENCE TO RELATED APPLICATIONS

The present application claims priority under 35 U.S.C. §119 to Japanese Patent Application No. 2012-084391, filed Apr. 2, 2012. The contents of this application are incorporated herein by reference in their entirety.

BACKGROUND OF THE INVENTION

1. Field of the Invention

The invention relates to a photoresist composition and a resist pattern-forming method.

2. Discussion of the Background

In the field of microfabrication used to produce an integrated circuit device or the like, lithographic technology that utilizes short-wavelength radiation (e.g., KrF excimer laser light (wavelength: 248 nm) or ArF excimer laser light (wavelength: 193 nm)) has been under development in order to achieve a higher degree of integration. A photoresist material that exhibits high sensitivity, high resolution, and the like is required when using such short-wavelength radiation. A chemically-amplified photoresist composition that includes an acid-labile group-containing component and an acid generator that generates an acid upon exposure to radiation has been widely used as the photoresist material (see Japanese Patent Application Publication (KOKAI) No. 59-45439).

A photoresist composition that includes a polymer including an alicyclic group that does not have significant absorption at 193 nm in its skeleton has been known as a composition that is suitable for ArF excimer laser light having a short wavelength. A polymer that includes a spirolactone structure has been proposed as the above polymer (see Japanese Patent Application Publication (KOKAI) No. 2002-82441 and Japanese Patent Application Publication (KOKAI) No. 2002-308937). It has been suggested that a polymer that includes a spirolactone structure improves the development contrast of a photoresist composition that includes the polymer.

SUMMARY OF THE INVENTION

According to one aspect of the invention, a photoresist composition includes a polymer component that includes a first structural unit represented by the following formula (1) and a second structural unit represented by the following formula (2), an acid generator, and a compound represented by the following formula (3). The first structural unit and the second structural unit are included in an identical polymer, or included in different polymers.

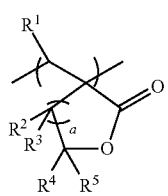

(1)

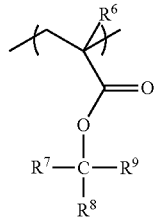

(2)

wherein $R^1$ is a hydrogen atom, a fluorine atom, a hydroxyl group, or a monovalent organic group having 1 to 20 carbon atoms, $R^2$ and $R^3$ are each independently a hydrogen atom, a fluorine atom, a hydroxyl group, or a monovalent organic group having 1 to 20 carbon atoms, or taken together represent a cyclic structure having 3 to 10 carbon atoms together with a carbon atom bonded to $R^2$ and $R^3$, a is an integer from 1 to 6, provided that a plurality of $R^2$ are identical or different and a plurality of $R^3$ are identical or different, when a is an integer equal to or larger than 2, $R^4$ and $R^5$ are each independently a hydrogen atom, a fluorine atom, a hydroxyl group, or a monovalent organic group having 1 to 20 carbon atoms, or taken together represent a cyclic structure having 3 to 10 carbon atoms together with a carbon atom bonded to $R^4$ and $R^5$, provided that some or all of the hydrogen atoms of a cyclic structure represented by at least one of $R^4$ and $R^5$ are substituted with a substituent or unsubstituted, $R^6$ is a hydrogen atom, a fluorine atom, a methyl group, or a trifluoromethyl group, $R^7$ and $R^8$ are each independently an alkyl group having 1 to 4 carbon atoms or an alicyclic group having 4 to 20 carbon atoms, or taken together represent a divalent alicyclic group together with a carbon atom bonded to $R^7$ and $R^8$, and $R^9$ is an alkyl group having 1 to 4 carbon atoms or an alicyclic group having 4 to 20 carbon atoms, provided that some or all of the hydrogen atoms of the alkyl group or the alicyclic group represented by $R^9$ are substituted with a substituent or unsubstituted.

$$R^{10}\text{-}A^-X^+ \quad (3)$$

wherein $R^{10}$ is a hydrogen atom or a monovalent organic group, $A^-$ is $-N^-SO_2-R^a$, $-COO^-$, $-O^-$, or $-SO_3^-$, provided that a fluorine atom is not bonded to a carbon atom bonded to $A^-$ when $A^-$ is $-SO_3^-$ and bonded to a carbon atom, $R^a$ is a linear or branched monovalent hydrocarbon group having 1 to 10 carbon atoms or a cyclic monovalent hydrocarbon group having 3 to 20 carbon atoms, provided that some or all of the hydrogen atoms of the hydrocarbon group represented by $R^a$ are substituted with a fluorine atom or unsubstituted, and $X^+$ is an onium cation.

According to another aspect of the invention, a resist pattern-forming method includes forming a resist film on a substrate using the photoresist composition, exposing the resist film, and developing the exposed resist film.

DESCRIPTION OF THE EMBODIMENTS

A photoresist composition according to one embodiment of the invention includes:

[A] a polymer component that includes a structural unit (I) represented by the following formula (1) and a structural unit (II) represented by the following formula (2), the structural unit (I) and the structural unit (II) being included in an identical polymer, or included in different polymers (hereinafter may be referred to as "polymer component [A]");

[B] an acid generator (hereinafter may be referred to as "acid generator [B]"); and

[C] a compound represented by the following formula (3) (hereinafter may be referred to as "compound [C]"),

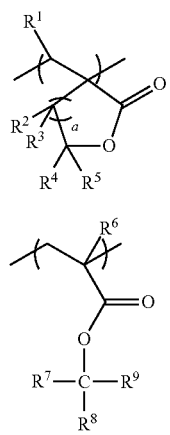

(1)

(2)

wherein $R^1$ is a hydrogen atom, a fluorine atom, a hydroxyl group, or a monovalent organic group having 1 to 20 carbon atoms, $R^2$ and $R^3$ are independently a hydrogen atom, a fluorine atom, a hydroxyl group, or a monovalent organic group having 1 to 20 carbon atoms, or bond to each other to form a cyclic structure having 3 to 10 carbon atoms together with the carbon atom bonded to $R^2$ and $R^3$, a is an integer from 1 to 6, provided that a plurality of $R^2$ may be identical or different and a plurality of $R^3$ may be either identical or different when a is an integer equal to or larger than 2, $R^4$ and $R^5$ are independently a hydrogen atom, a fluorine atom, a hydroxyl group, or a monovalent organic group having 1 to 20 carbon atoms, or bond to each other to form a cyclic structure having 3 to 10 carbon atoms together with the carbon atom bonded to $R^4$ and $R^5$, provided that some or all of the hydrogen atoms of the cyclic structure may be substituted with a substituent, $R^6$ is a hydrogen atom, a fluorine atom, a methyl group, or a trifluoromethyl group, $R^7$ and $R^8$ are independently an alkyl group having 1 to 4 carbon atoms or an alicyclic group having 4 to 20 carbon atoms, or bond to each other to form a divalent alicyclic group together with the carbon atom bonded to $R^7$ and $R^8$, and $R^9$ is an alkyl group having 1 to 4 carbon atoms or an alicyclic group having 4 to 20 carbon atoms, provided that some or all of the hydrogen atoms of the alkyl group or the alicyclic group may be substituted with a substituent, $$R^{10}\text{-}A^-X^+ \quad (3)$$

wherein $R^{10}$ is a hydrogen atom or a monovalent organic group, $A^-$ is $-N-SO_2-R^a$, $-COO^-$, $-O^-$, or $-SO_3^-$, provided that a fluorine atom is not bonded to a carbon atom bonded to $A^-$ when $A^-$ is $-SO_3^-$ and bonded to a carbon atom, $R^a$ is a linear or branched monovalent hydrocarbon group having 1 to 10 carbon atoms or a cyclic monovalent hydrocarbon group having 3 to 20 carbon atoms, provided that some or all of the hydrogen atoms of the hydrocarbon group may be substituted with a fluorine atom, and $X^+$ is an onium cation.

The photoresist composition includes the polymer component [A] and the compound [C] that has the above specific structure, the polymer component [A] including the structural unit (I) that is represented by the formula (1) and includes the specific lactone structure bonded directly to the polymer main chain, and the structural unit (II) that is represented by the formula (2) and includes an acid-labile group. As a result, the photoresist composition exhibits excellent lithographic performance (e.g., MEEF, LWR, and DOF).

The reason why the photoresist composition having the above configuration achieves the above advantageous effects has not necessarily been clarified, but may be conjectured to be as follows, for example. Specifically, when the polymer component [A] includes the structural unit (I) that has the above specific structure, the dispersibility of the compound [C] (i.e., onium salt) in the resist film increases. This makes it possible to accurately control diffusion of the acid generated by the acid generator [B] in the resist film. Therefore, the photoresist composition exhibits improved lithographic performance (e.g., MEEF, LWR, and DOF).

It is preferable that $X^+$ in the formula (3) be at least one onium cation selected from the group consisting of an onium cation represented by the following formula (4-1) and an onium cation represented by the following formula (4-2).

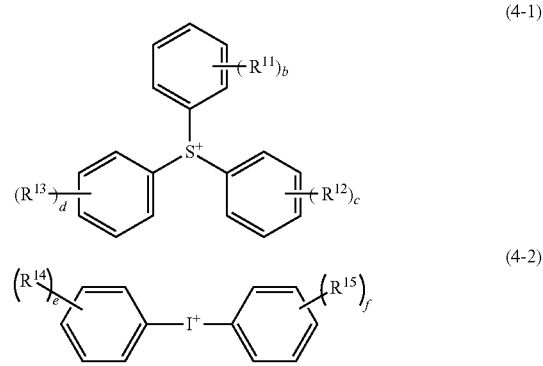

(4-1)

(4-2)

wherein $R^{11}$ to $R^{15}$ are independently a hydroxyl group, a halogen atom, an alkyl group, a cycloalkyl group, an alkoxy group, $-S-R^A$, $-OSO_2-R^B$, or $-SO_2-R^C$, $R^A$ is an alkyl group or an aryl group, $R^B$ and $R^C$ are independently an alkyl group, a cycloalkyl group, an alkoxy group, or an aryl group, provided that some or all of the hydrogen atoms of the alkyl group, the cycloalkyl group, the alkoxy group, and the aryl group represented by $R^{11}$ to $R^{15}$, $R^A$, $R^B$, and $R^C$ may be substituted with a substituent, and b, c, d, e, and f are independently an integer from 0 to 5, provided that a plurality of $R^{11}$ may be either identical or different when a plurality of $R^{11}$ are present, a plurality of $R^{12}$ may be either identical or different when a plurality of $R^{12}$ are present, a plurality of $R^{13}$ may be either identical or different when a plurality of $R^{13}$ are present, a plurality of $R^{14}$ may be either identical or different when a plurality of $R^{14}$ are present, and a plurality of $R^{15}$ may be either identical or different when a plurality of $R^{15}$ are present.

When $X^+$ is an onium cation having the above specific structure, the dispersibility of the compound [C] in the resist film is improved, and it is possible to more accurately control diffusion of the acid generated by the acid generator [B] in the resist film. This makes it possible to further improve the lithographic performance (e.g., MEEF (mask error enhancement factor), DOF (depth of focus), and LWR (line width roughness)) of the photoresist composition.

It is preferable that the polymer component [A] further include at least one group (a) selected from the group consisting of a lactone group, a cyclic carbonate group, and a sultone group. When the polymer component [A] includes the above specific group, the photoresist composition exhibits further improved lithographic performance (e.g., MEEF, LWR, and DOF).

It is preferable that the group (a) be included in a structural unit (III) other than the structural unit (I) and the structural unit (II). The photoresist composition that includes the polymer component [A] that includes the structural unit (III) exhibits further improved lithographic performance (e.g., MEEF, DOF, and LWR).

The structural unit (III) is preferably a structural unit represented by the following formula (5).

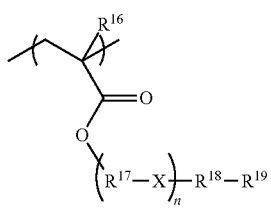

(5)

wherein $R^{16}$ is a hydrogen atom, a fluorine atom, a methyl group, or a trifluoromethyl group, $R^{17}$ is a hydrocarbon group having 1 to 10 carbon atoms, X is —O—, —COO—, —COO—, or —NH—, n is an integer from 0 to 10, provided that a plurality of $R^{17}$ may be either identical or different and a plurality of X may be either identical or different when n is an integer equal to or larger than 2, $R^{18}$ is a single bond or a hydrocarbon group having 1 to 5 carbon atoms, provided that some or all of the hydrogen atoms of the hydrocarbon group represented by $R^{17}$ and $R^{18}$ may be substituted with a substituent, and $R^{19}$ is a lactone group, a cyclic carbonate group, or a sultone group.

The photoresist composition that includes the polymer component [A] that includes the structural unit (III) having the above specific structure exhibits further improved lithographic performance (e.g., MEEF, DOF, and LWR).

It is also preferable that the group (a) be included in the structural unit (I). When the structural unit (I) includes the group (a), the photoresist composition exhibits further improved lithographic performance (e.g., MEEF, LWR, DOF).

It is preferable that the lactone group be a norbornanelactone group or a butyrolactone group, the cyclic carbonate group be an ethylene carbonate group, and the sultone group be a norbornanesultone group. When the group (a) is the above group, the photoresist composition exhibits further improved lithographic performance (e.g., MEEF, LWR, and DOF).

The content of the structural unit (I) in the polymer component [A] is preferably 1 to 60 mol %. When the content of the structural unit (I) in the polymer component [A] is within the above range, the photoresist composition exhibits improved lithographic performance (e.g., MEEF, LWR, and DOF).

The photoresist composition preferably includes the compound [C] in an amount of 0.1 to 20 parts by mass based on 100 parts by mass of the polymer component [A]. When the amount of the compound [C] is within the above range, the photoresist composition exhibits improved lithographic performance (e.g., MEEF, LWR, and DOF).

According to another embodiment of the invention, a resist pattern-forming method includes (1) forming a resist film on a substrate using the photoresist composition, (2) exposing the resist film, and (3) developing the exposed resist film.

Since the resist pattern-forming method utilizes the photoresist composition according to the embodiment of the invention, it is possible to form a fine resist pattern that exhibits a wide DOF, a small MEEF, and small LWR.

Since the photoresist composition according to the embodiments of the invention includes the polymer component [A] that includes the structural unit (I) that includes the specific lactone structure bonded directly to the polymer main chain and the structural unit (II) that includes an acid-labile group, and the compound [C], the photoresist composition exhibits satisfactory basic properties (e.g., sensitivity), and exhibits excellent lithographic performance (e.g., MEEF, LWR, and DOF). Therefore, the photoresist composition may suitably be used for lithography for which a further reduction in line width will be desired. The embodiments will now be described in detail.

Photoresist Composition

The photoresist composition according to the embodiments of the invention includes the polymer component [A], the acid generator [B], and the compound [C]. The photoresist composition may further include an optional component as long as the advantageous effects of the invention are not impaired. Each component included in the photoresist composition is described in detail below.

Polymer Component [A]

The polymer component [A] includes the structural unit (I) represented by the formula (1) and the structural unit (II) represented by the formula (2), the structural unit (I) and the structural unit (II) being included in an identical polymer, or included in different polymers. The photoresist composition that includes the polymer component [A], the acid generator [B], and the compound [C] exhibits satisfactory basic properties (e.g., sensitivity), and exhibits excellent lithographic performance (e.g., MEEF, LWR, and DOF).

The polymer component [A] may be a copolymer of a plurality of monomer compounds (e.g., a monomer compound that produces the structural unit (I) and a monomer compound that produces the structural unit (II)), or may be a component that includes a plurality of polymers (e.g., a polymer of a monomer compound that produces the structural unit (I) and a polymer of a monomer compound that produces the structural unit (II))).

It is preferable that the polymer component [A] further include a structural unit (IV) that includes a polar group (excluding a structural unit that falls under the structural unit (I)) in addition to the structural unit (I) and the structural unit (II). It is also preferable that the polymer component [A] further include at least one group (a) selected from the group consisting of a lactone group, a cyclic carbonate group, and a sultone group. The group (a) may be included in the structural unit (I), or may be included in the structural unit (III), or may be included in the structural unit (I) and the structural unit (III). When the polymer component [A] includes the group (a), the photoresist composition exhibits improved lithographic performance (e.g., MEEF, LWR, and DOF). The polymer component [A] may further include an additional structural unit as long as the advantageous effects of the invention are not impaired. Each structural unit is described in detail below.

Structural Unit (I)

The structural unit (I) is represented by the formula (1).

In the formula (1), $R^1$ is a hydrogen atom, a fluorine atom, a hydroxyl group, or a monovalent organic group having 1 to 20 carbon atoms. $R^2$ and $R^3$ are independently a hydrogen atom, a fluorine atom, a hydroxyl group, or a monovalent organic group having 1 to 20 carbon atoms, or bond to each other to form a cyclic structure having 3 to 10 carbon atoms together with the carbon atom bonded to $R^2$ and $R^3$. a is an integer from 1 to 6, provided that a plurality of $R^2$ may be identical or different and a plurality of $R^3$ may be either identical or different when a is an integer equal to or larger than 2. $R^4$ and $R^5$ are independently a hydrogen atom, a fluorine atom, a hydroxyl group, or a monovalent organic group having 1 to 20 carbon atoms, or bond to each other to form a cyclic structure having 3 to 10 carbon atoms together with the carbon atom bonded to $R^4$ and $R^5$, provided that some or all of the hydrogen atoms of the cyclic structure may be substituted with a substituent.

Examples of the monovalent organic group having 1 to 20 carbon atoms represented by $R^1$ to $R^5$ include a chain-like hydrocarbon group having 1 to 20 carbon atoms, an alicyclic hydrocarbon group having 3 to 20 carbon atoms, an aromatic hydrocarbon group having 6 to 20 carbon atoms, a heterocyclic group having 3 to 10 nucleus atoms, an epoxy group, a cyano group, a carboxyl group, a group represented by —R'-Q-R", and the like. Note that R' is a single bond or a hydrocarbon group having 1 to 20 carbon atoms, R" is a substituted or unsubstituted hydrocarbon group having 1 to 20 carbon atoms, and Q is —O—, —CO—, —NH—, —SO$_2$—, —SO—, or a combination thereof.

Some or all of the hydrogen atoms of the chain-like hydrocarbon group, the alicyclic hydrocarbon group, and the aromatic hydrocarbon group may be substituted with a halogen atom (e.g., fluorine atom), a cyano group, a carboxyl group, a hydroxyl group, a thiol group, or the like.

Examples of the chain-like hydrocarbon group having 1 to 20 carbon atoms include a methyl group, an ethyl group, a propyl group, a butyl group, a pentyl group, a hexyl group, an octyl group, a decyl group, and the like. Among these, a methyl group, an ethyl group, a propyl group, a butyl group, and a pentyl group are preferable, and a methyl group and an ethyl group are more preferable.

Examples of the alicyclic hydrocarbon group having 3 to 20 carbon atoms include monoalicyclic hydrocarbon groups such as a cyclopropyl group, a cyclobutyl group, a cyclohexyl group, a cyclooctyl group, and a cyclodecyl group; polyalicyclic hydrocarbon groups such as a norbornyl group and an adamantyl group; and the like.

Examples of the aromatic hydrocarbon group having 6 to 20 carbon atoms include a phenyl group, a naphthyl group, and the like.

Examples of the heterocyclic group having 3 to 10 nucleus atoms include a lactone group, a cyclic carbonate group, a sultone group, a group that includes a furan ring, a group that includes a thiophene ring, a group that includes a benzofuran ring, a group that includes a benzothiophene ring, a group that includes a dibenzofuran ring, a group that includes a dibenzothiophene ring, a group that includes a pyridine ring, and the like. Among these, a lactone group, a cyclic carbonate group, and a sultone group are preferable, and a lactone group is more preferable.

Examples of the hydrocarbon group having 1 to 20 carbon atoms represented by R' and R" in the group represented by —R'-Q-R" include a chain-like hydrocarbon group having 1 to 20 carbon atoms, an alicyclic hydrocarbon group having 3 to 20 carbon atoms, an aromatic hydrocarbon group having 6 to 20 carbon atoms, and the like. Examples of the chain-like hydrocarbon group having 1 to 20 carbon atoms, the alicyclic hydrocarbon group having 3 to 20 carbon atoms, and the aromatic hydrocarbon group having 6 to 20 carbon atoms include those mentioned above in connection with the monovalent organic group having 1 to 20 carbon atoms represented by $R^1$ to $R^5$.

Examples of the group that includes the cyclic structure having 3 to 10 carbon atoms formed by $R^2$ and $R^3$ together with the carbon atom bonded to $R^2$ and $R^3$ and the group that includes the cyclic structure having 3 to 10 carbon atoms formed by $R^4$ and $R^5$ together with the carbon atom bonded to $R^4$ and $R^5$ include alicyclic groups such as a cyclopropanediyl group, a cyclohexanediyl group, a norbornanediyl group, and an adamantanediyl group, heterocyclic groups that include a heteroatom (e.g., oxygen atom, sulfur atom, or nitrogen atom), and the like. A cyclopentanediyl group, a cyclohexanediyl group, and an adamantanediyl group are preferable as the alicyclic group, and a cyclic ether group, a lactone group, a cyclic carbonate group, and a sultone group are preferable as the heterocyclic group.

a is preferably 1 or 2, and more preferably 1.

Examples of the structural unit (I) include structural units represented by the following formulas (1-1) to (1-79), and the like.

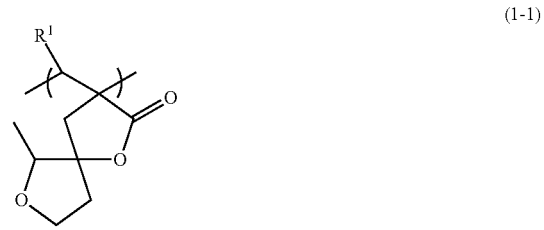

(1-1)

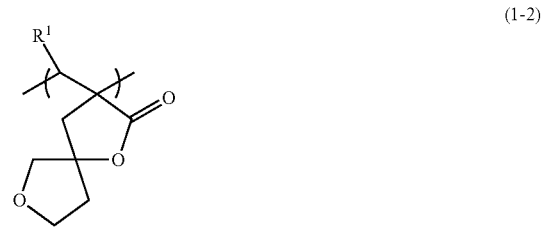

(1-2)

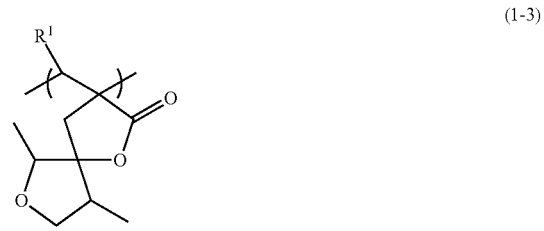

(1-3)

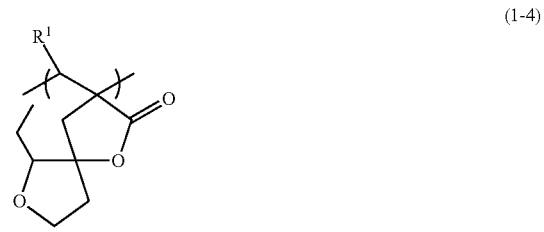

(1-4)

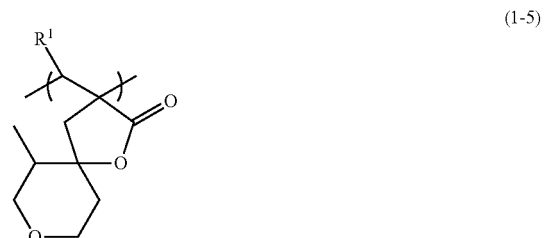

(1-5)

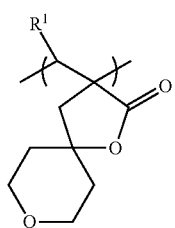
(1-6)
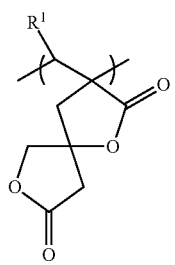
(1-7)
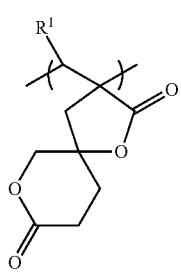
(1-8)
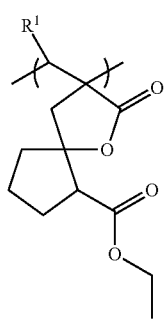
(1-9)
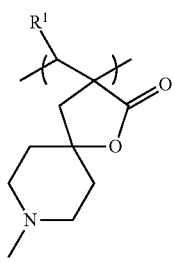
(1-10)
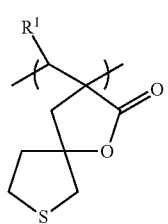
(1-11)
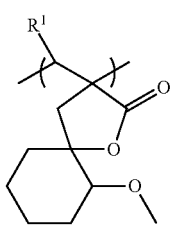
(1-12)
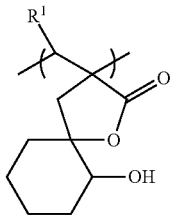
(1-13)
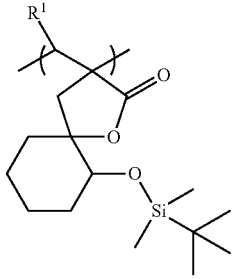
(1-14)
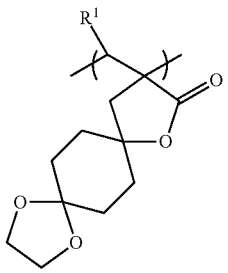
(1-15)
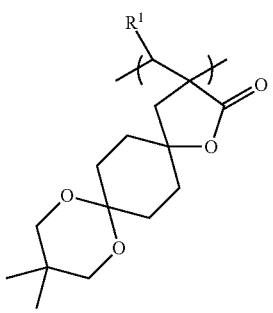
(1-16)
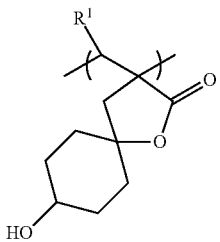
(1-17)

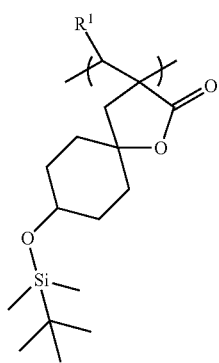
(1-18)
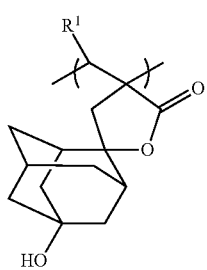
(1-19)
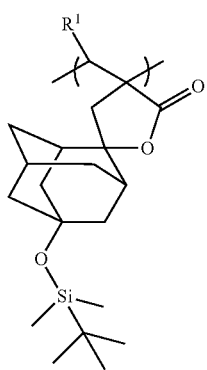
(1-20)
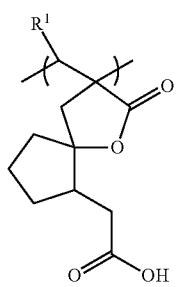
(1-21)
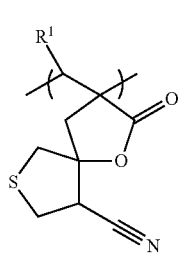
(1-22)
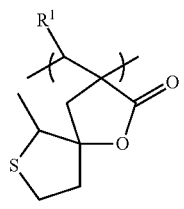
(1-23)
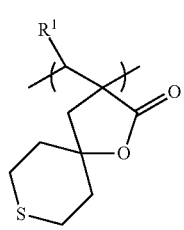
(1-24)
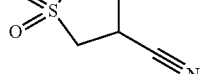
(1-25)
(1-26)
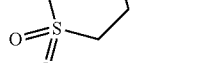
(1-27)
(1-28)
(1-29)

(1-30) 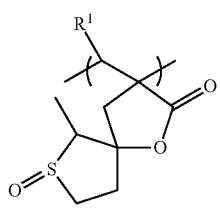
(1-31) 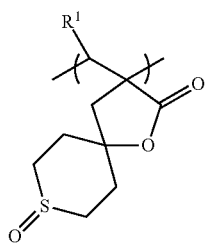
(1-32) 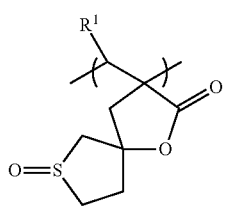
(1-33) 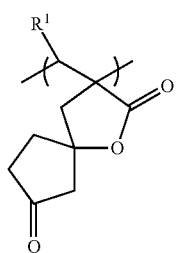
(1-34) 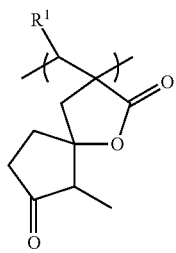
(1-35) 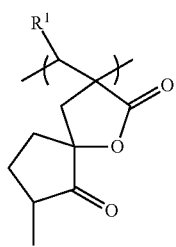
(1-36) 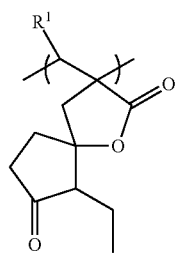
(1-37) 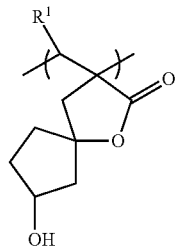
(1-38) 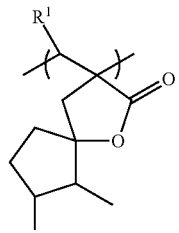
(1-39) 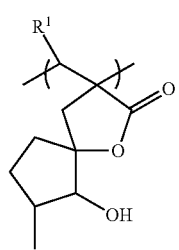
(1-40) 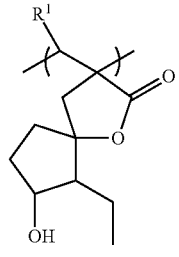
(1-41) 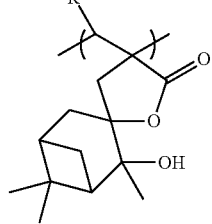

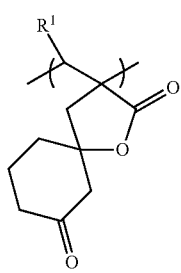
(1-42)
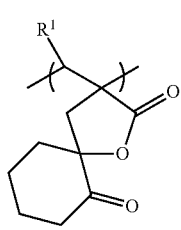
(1-43)
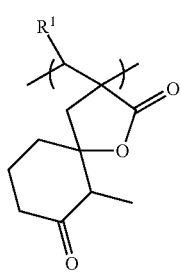
(1-44)
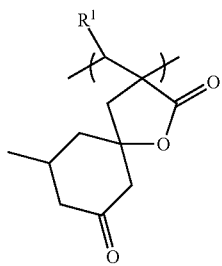
(1-45)
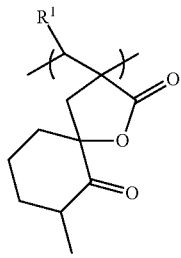
(1-46)
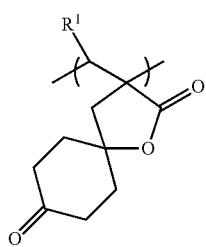
(1-47)
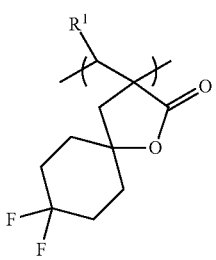
(1-48)
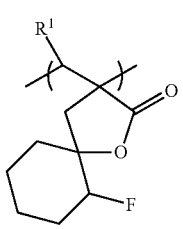
(1-49)
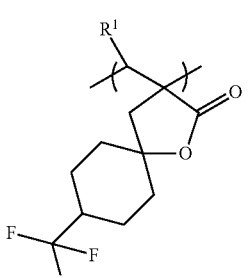
(1-50)
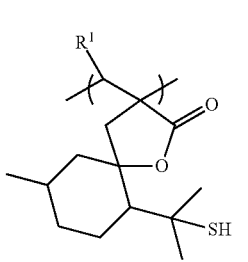
(1-51)
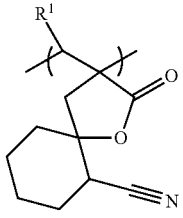
(1-52)
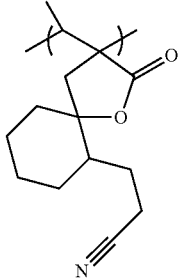
(1-53)

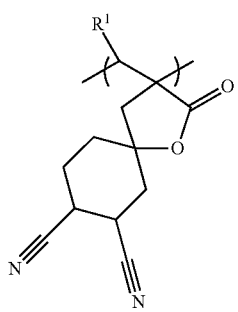 (1-54)
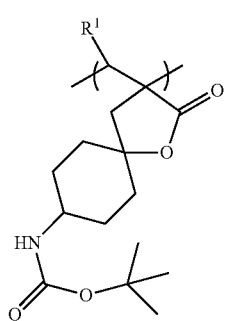 (1-55)
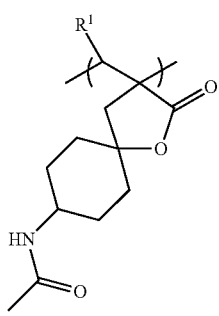 (1-56)
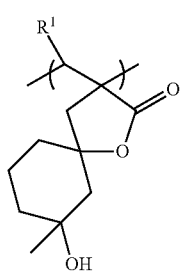 (1-57)
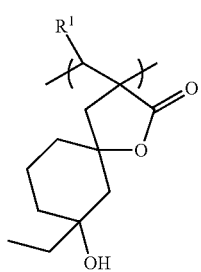 (1-58)
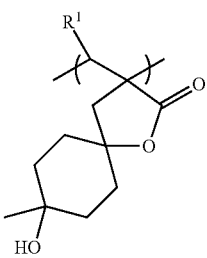 (1-59)
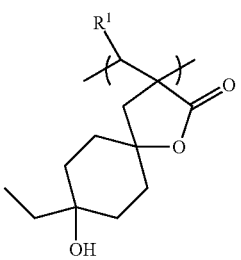 (1-60)
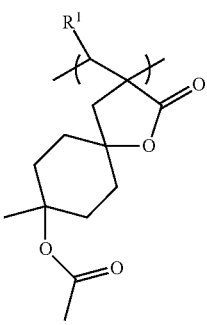 (1-61)
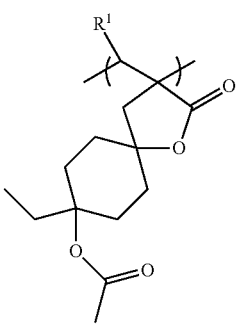 (1-62)
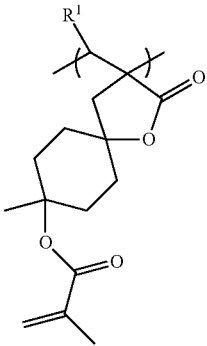 (1-63)

(1-64)
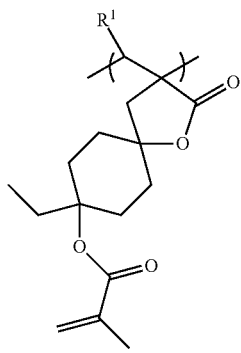
(1-65)
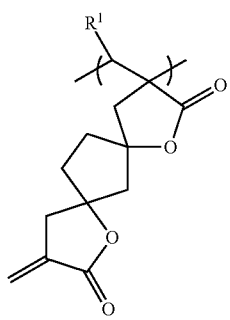
(1-66)
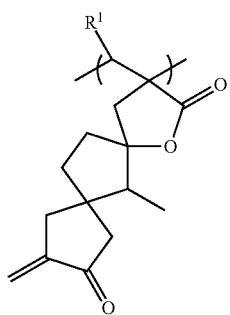
(1-67)
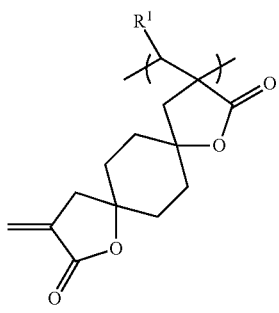
(1-68)
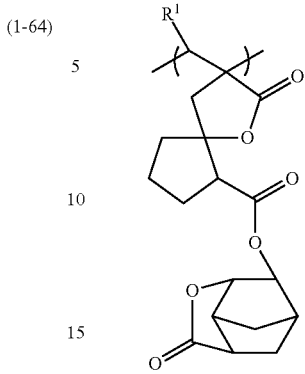
(1-69)
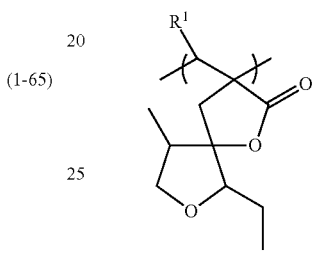
(1-70)
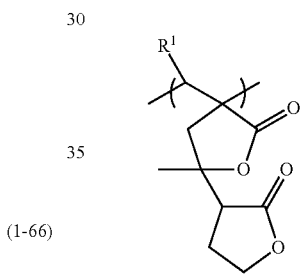
(1-71)
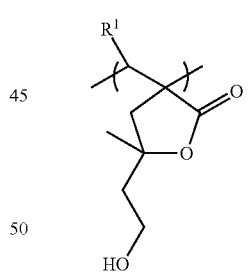
(1-72)
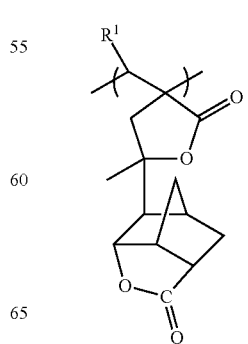

(1-73) 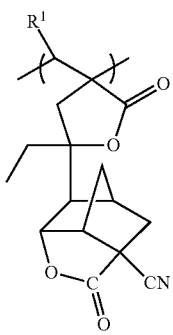

(1-74) 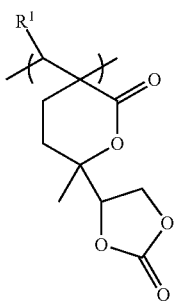

(1-75) 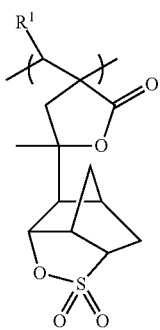

(1-76) 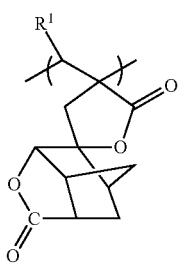

(1-77) 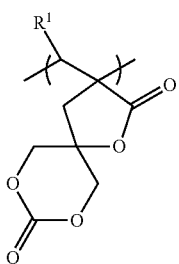

(1-78) 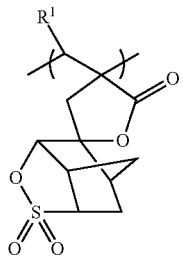

(1-79) 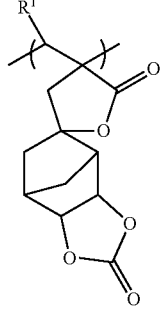

wherein $R^1$ is the same as defined for the formula (1).

Among these, a structural unit in which at least one of $R^4$ and $R^5$ includes an oxygen atom, a structural unit in which at least one of $R^4$ and $R^5$ is a cyclic organic group, and a structural unit in which $R^4$ and $R^5$ bond to each other to form a cyclic structure together with the carbon atom bonded to $R^4$ and $R^5$, are preferable. The structural units represented by the formulas (1-1) to (1-9), (1-12) to (1-21), (1-25) to (1-47), (1-55) to (1-67), and (1-69) to (1-71) are more preferable, and the structural units represented by the formulas (1-1), (1-17), (1-19), (1-70), and (1-71) are particularly preferable.

The content of the structural unit (I) in the polymer component [A] is preferably 1 to 60 mol %, and more preferably 5 to 55 mol %, based on the total structural units included in the polymer component [A]. When the content of the structural unit (I) is within the above range, lithographic performance (e.g., MEEF, DOF, and LWR) can be effectively improved. The polymer component [A] may include only one type of the structural unit (I), or may include two or more types of the structural unit (I).

Examples of a monomer that produces the structural unit (I) include the compounds represented by the following formulas.

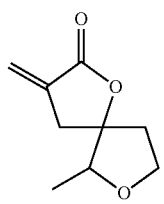 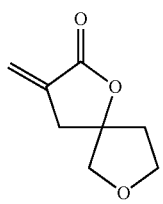 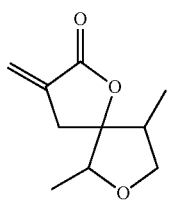

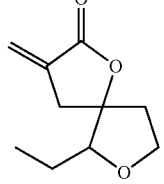 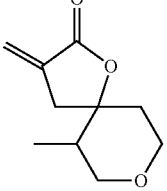 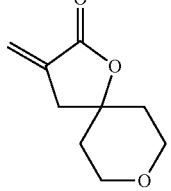

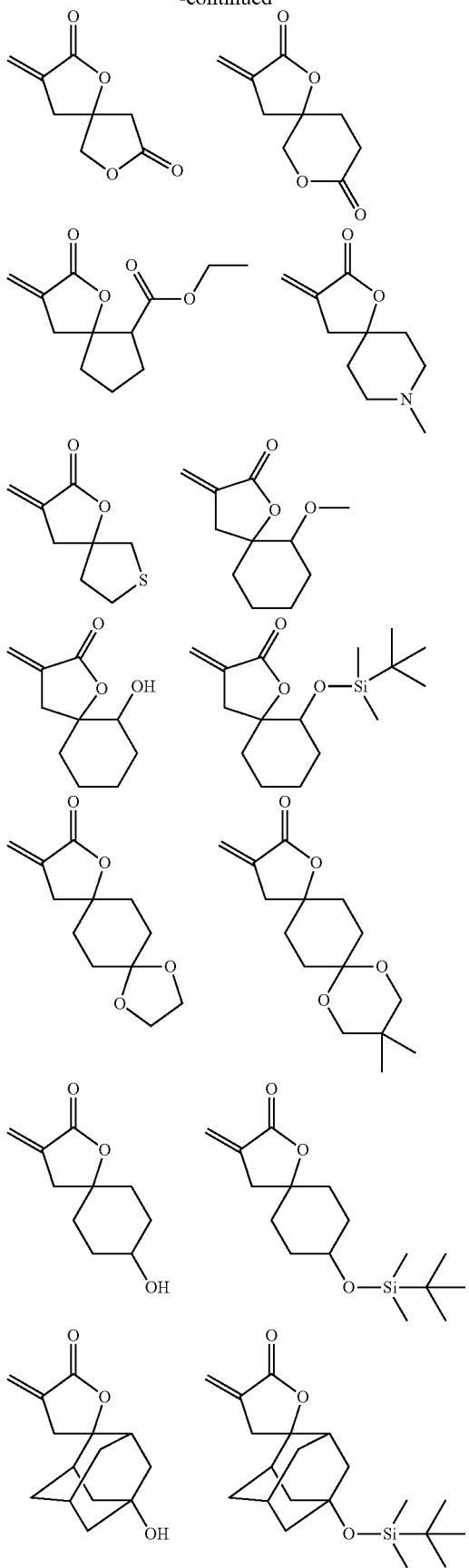
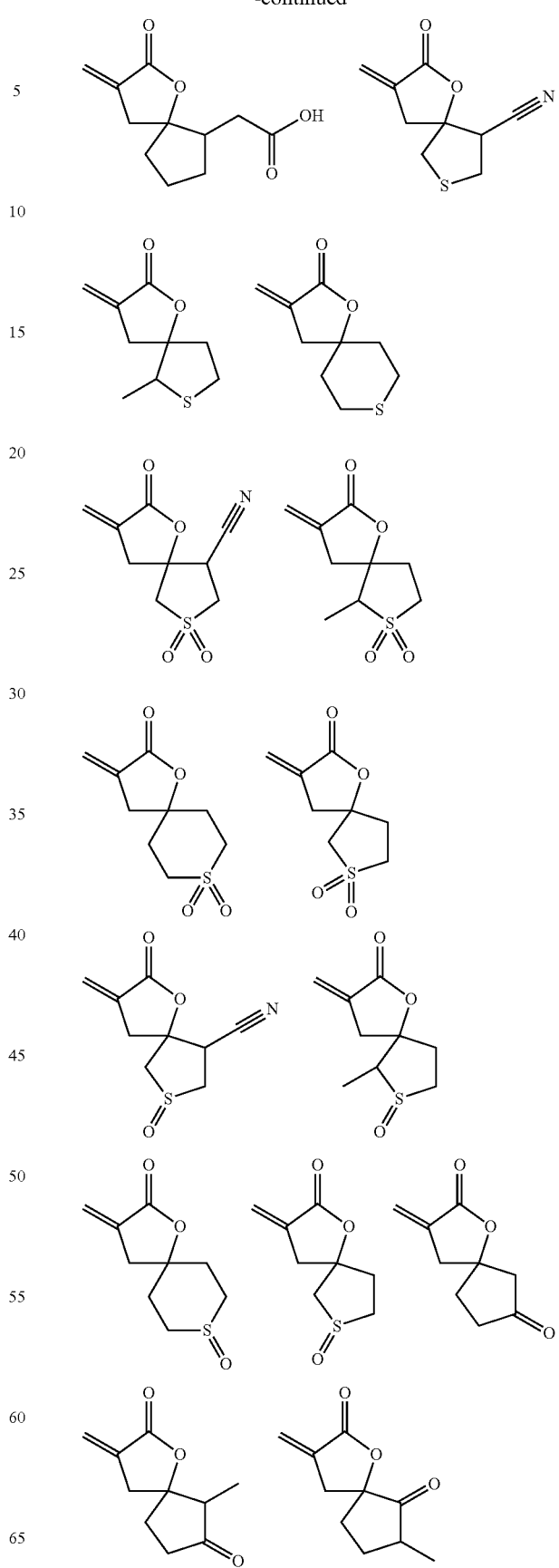

-continued
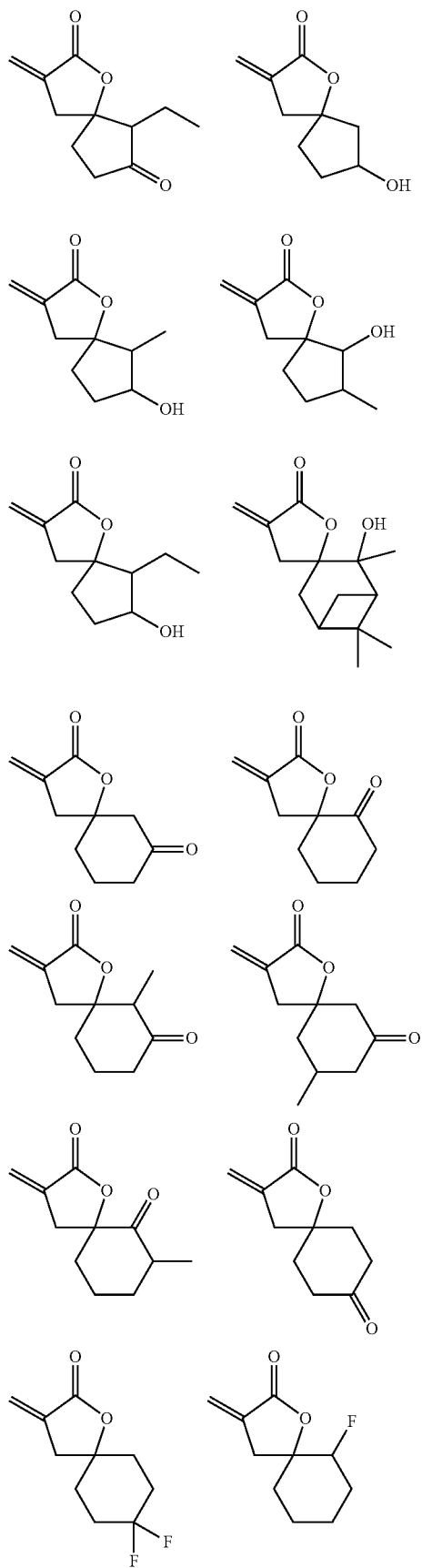
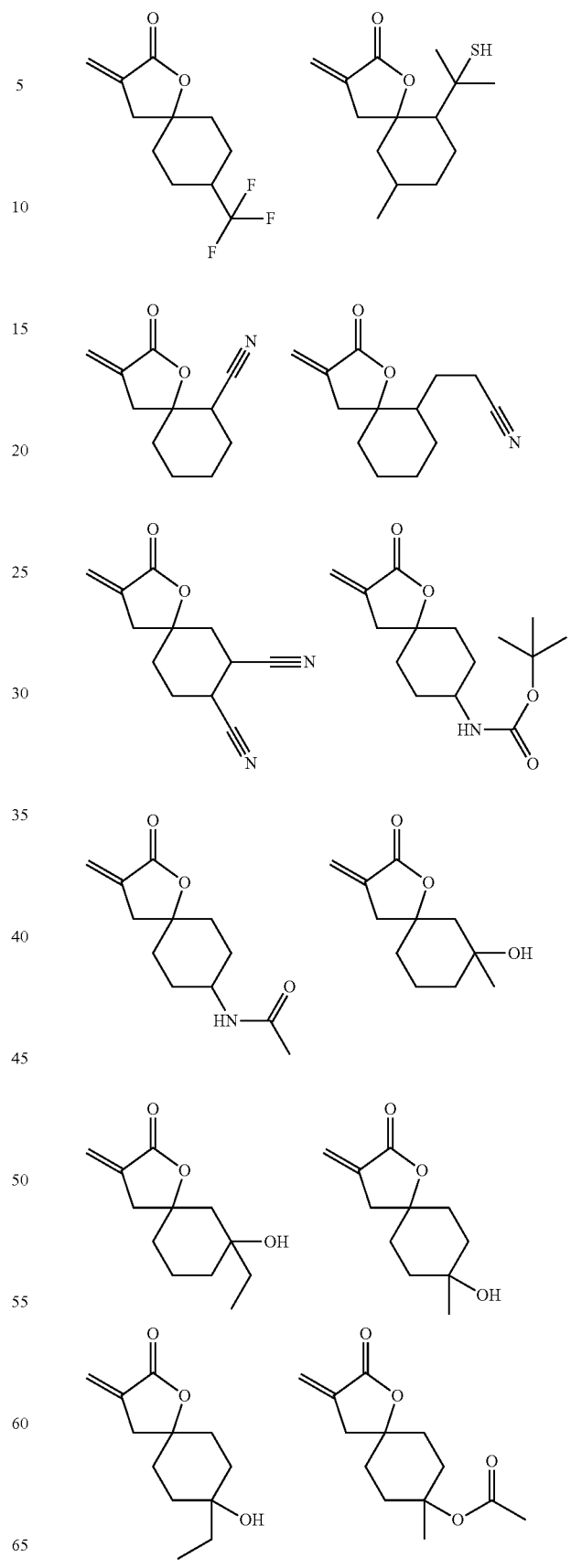

-continued

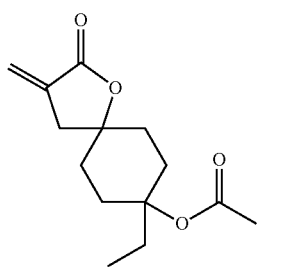
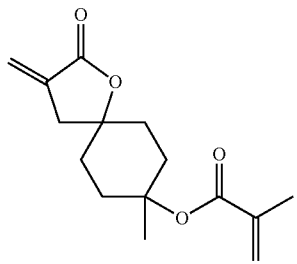
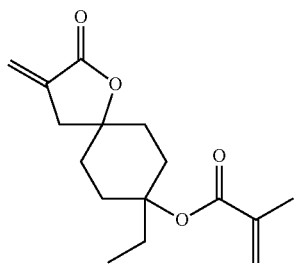
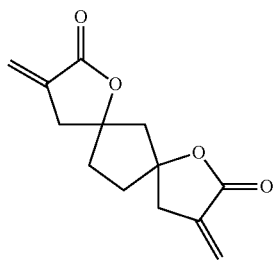
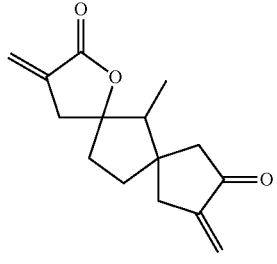
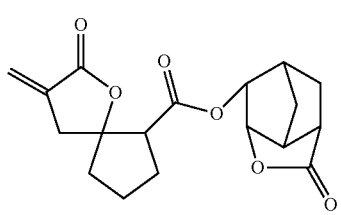

-continued

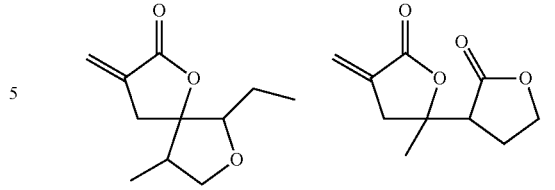
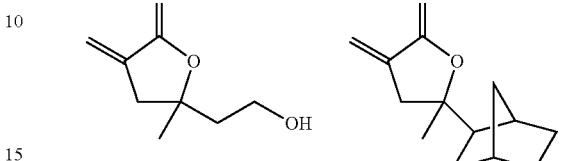
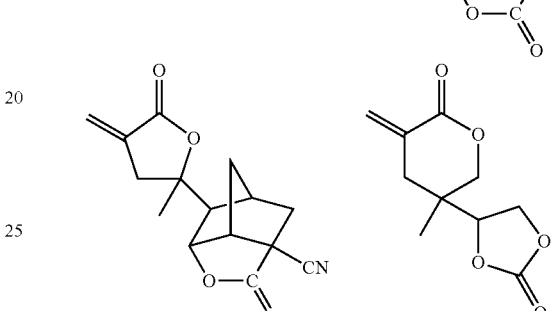
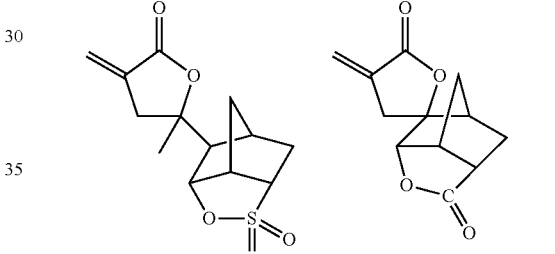
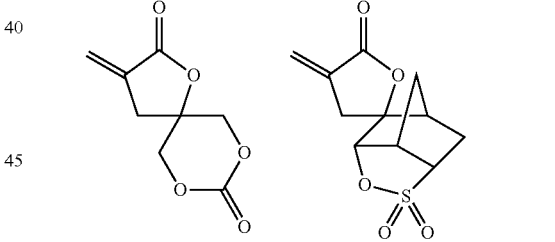
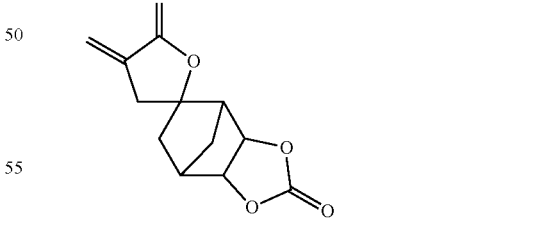

A monomer that produces the structural unit (I) may be produced as described below, for example.

Specifically, 2-methyltetrahydrofuran-3-one (compound a) dissolved in tetrahydrofuran (THF) and ethyl (2-bromomethyl)acrylate (compound b) dissolved in THF are added dropwise to THF containing a zinc powder (catalyst), and the mixture is stirred at room temperature to react the compound a and the compound b to synthesize 6-methyl-3-methylene-1,7-dioxaspiro[4.4]nonan-2-one (i.e., a compound that produces the structural unit represented by the formula (1-1)). It is preferable to add an activator (e.g., chlorotrimethylsilane) to THF containing a zinc powder before adding the compound a and the compound b. A compound that produces a structural unit other than the structural unit represented by the formula (1-1) may be similarly synthesized by appropriately changing the compound a, for example.

Structural Unit (II)

The structural unit (II) is represented by the formula (2). The structural unit (II) includes an acid-labile group that dissociates due to an acid generated by the acid generator [B] upon exposure. As a result, the photoresist composition exhibits improved basic properties (e.g., sensitivity) and improved lithographic performance (e.g., MEEF, DOF, and LWR).

In the formula (2), $R^6$ a hydrogen atom, a fluorine atom, a methyl group, or a trifluoromethyl group. $R^7$ and $R^8$ are independently an alkyl group having 1 to 4 carbon atoms or an alicyclic group having 4 to 20 carbon atoms, or bond to each other to form a divalent alicyclic group together with the carbon atom bonded to $R^7$ and $R^8$. $R^9$ is an alkyl group having 1 to 4 carbon atoms or an alicyclic group having 4 to 20 carbon atoms, provided that some or all of the hydrogen atoms of the alkyl group or the alicyclic group may be substituted with a substituent.

Examples of the alkyl group having 1 to 4 carbon atoms represented by $R^7$ to $R^9$ include a methyl group, an ethyl group, an n-propyl group, an i-propyl group, an n-butyl group, a t-butyl group, a 2-methylpropyl group, a 1-methylpropyl group, and the like.

Examples of the alicyclic group having 4 to 20 carbon atoms represented by $R^7$ to $R^9$ and the alicyclic group formed by $R^7$ and $R^8$ together with the carbon atom bonded to $R^7$ and $R^8$ include polyalicyclic groups that include a bridged skeleton (e.g., adamantane skeleton or norbornane skeleton), and monoalicyclic groups that include a cycloalkane skeleton (e.g., cyclopentane or cyclohexane). These groups may be substituted with one or more linear, branched, or cyclic alkyl groups having 1 to 10 carbon atoms, for example.

Structural units represented by the following formulas are preferable as the structural unit (II).

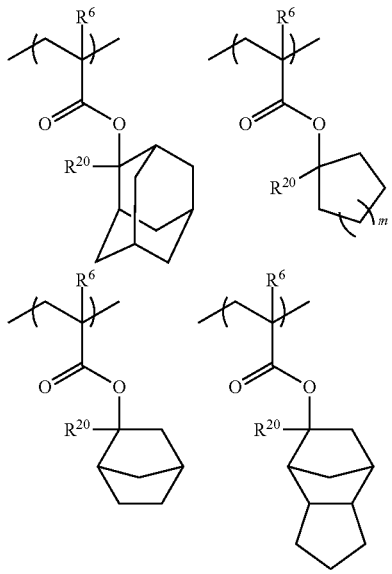

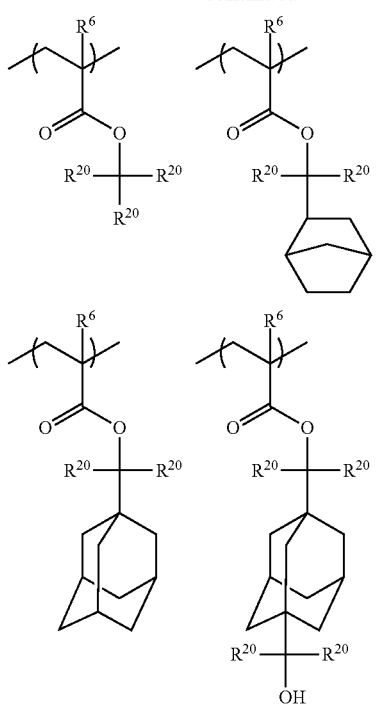

wherein $R^6$ is the same as defined for the formula (2), $R^{20}$ are independently an alkyl group having 1 to 4 carbon atoms, and m is an integer from 1 to 6.

Among these, structural units represented by the following formulas (2-1) and (2-22) are more preferable.

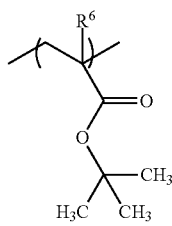

(2-1)

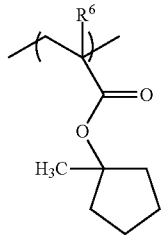

(2-2)

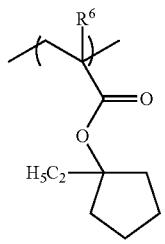

(2-3)

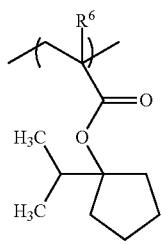 (2-4)
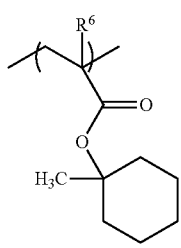 (2-5)
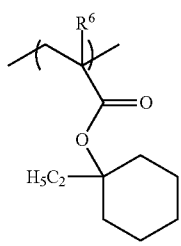 (2-6)
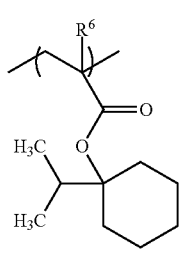 (2-7)
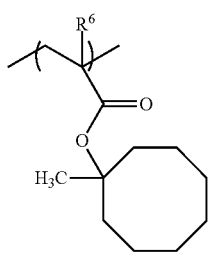 (2-8)
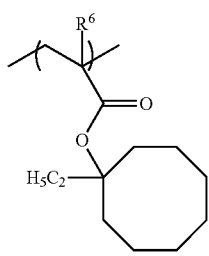 (2-9)
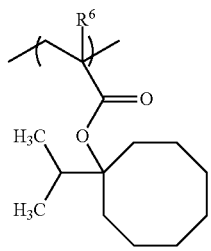 (2-10)
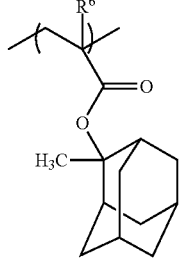 (2-11)
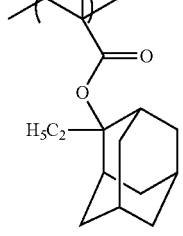 (2-12)
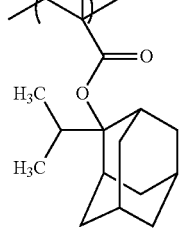 (2-13)
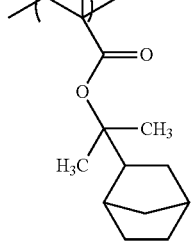 (2-14)
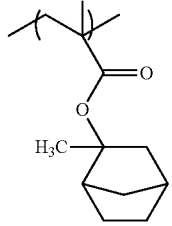 (2-15)

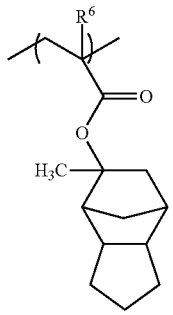
(2-16)

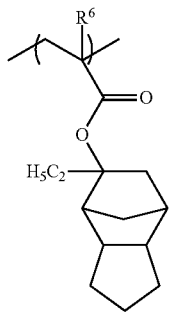
(2-17)

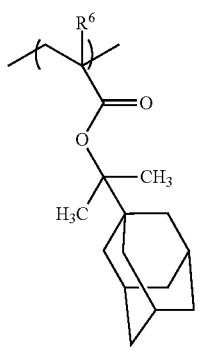
(2-18)

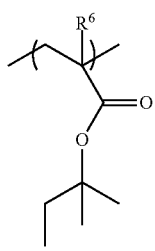
(2-19)

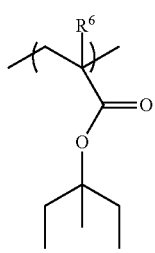
(2-20)

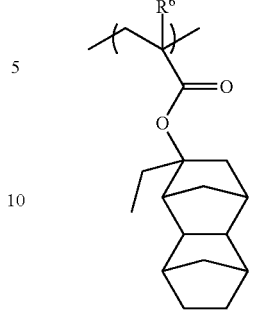
(2-21)

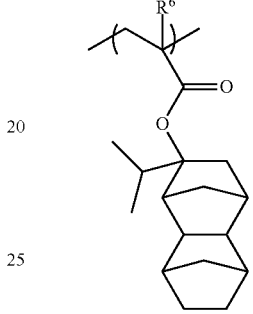
(2-22)

wherein $R^6$ is the same as defined for the formula (2).

Among these, the structural units represented by the formulas (2-1) to (2-9), (2-11) to (2-15), and (2-18) to (2-22) are still more preferable.

The content of the structural unit (II) in the polymer component [A] is preferably 10 to 80 mol %, more preferably 15 to 80 mol %, and still more preferably 20 to 75 mol %, based on the total structural units included in the polymer component [A]. When the content of the structural unit (II) is within the above range, basic properties (e.g., sensitivity) and lithographic performance (e.g., MEEF, DOF, and LWR) are effectively improved. The polymer component [A] may include only one type of the structural unit (II), or may include two or more types of the structural unit (II).

Examples of a monomer that produces the structural unit (II) include bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tricyclo[3.3.1.1$^{3,7}$]dec-1-yl(meth)acrylate, tricyclo[3.3.1.1$^{3,7}$]dec-2-yl(meth)acrylate, and the like.

Structural Unit (III)

The structural unit (III) is a structural unit that does not fall under the structural unit (I) and the structural unit (II) and includes at least one group (a) selected from the group consisting of a lactone group, a cyclic carbonate group, and a sultone group. The photoresist composition that includes the polymer component [A] that includes the structural unit (III) exhibits improved lithographic performance (e.g., MEEF, DOF, and LWR).

The structural unit (III) is preferably a structural unit represented by the formula (5). The photoresist composition that includes the polymer component [A] that includes the structural unit (III) having the above specific structure exhibits further improved lithographic performance (e.g., MEEF, DOF, and LWR).

In the formula (5), $R^{16}$ is a hydrogen atom, a fluorine atom, a methyl group, or a trifluoromethyl group. $R^{17}$ is a hydrocarbon group having 1 to 10 carbon atoms. X is —O—, —COO—, —COO—, or —NH—. n is an integer from 0 to 10, provided that a plurality of $R^{17}$ may be either identical or different and a plurality of X may be either identical or different when n is an integer equal to or larger than 2. $R^{18}$ is a single bond or a hydrocarbon group having 1 to 5 carbon atoms, provided that some or all of the hydrogen atoms of the hydrocarbon group represented by $R^{17}$ and $R^{18}$ may be substituted with a substituent. $R^{19}$ is a lactone group, a cyclic carbonate group, or a sultone group.

Examples of the hydrocarbon group having 1 to 10 carbon atoms represented by $R^{17}$ include a chain-like hydrocarbon group having 1 to 10 carbon atoms, an alicyclic hydrocarbon group having 3 to 10 carbon atoms, an aromatic hydrocarbon group having 6 to 10 carbon atoms, and the like.

Examples of the chain-like hydrocarbon group having 1 to 10 carbon atoms include a methylene group, an ethylene group, a propylene group, and the like. Among these, a methylene group and an ethylene group are preferable.

Examples of the alicyclic hydrocarbon group having 3 to 10 carbon atoms include a cyclopropylene group, a cyclohexylene group, an adamantylene group, and the like. Among these, an adamantylene group is preferable.

Examples of the aromatic hydrocarbon group having 6 to 10 carbon atoms include a phenylene group, a naphthylene group, and the like.

X is preferably —O— or —COO—.

n is preferably an integer from 0 to 5, and more preferably 0 or 1.

Examples of the hydrocarbon group having 1 to 5 carbon atoms represented by $R^{18}$ include a chain-like hydrocarbon group having 1 to 5 carbon atoms, an alicyclic hydrocarbon group having 3 to 5 carbon atoms, and the like.

Examples of the chain-like hydrocarbon group having 1 to 5 carbon atoms include a methylene group, an ethylene group, a propylene group, and the like. Among these, a methylene group is preferable.

Examples of the alicyclic hydrocarbon group having 3 to 5 carbon atoms include a cyclopropylene group, a cyclobutylene group, and the like.

$R^{18}$ is preferably a single bond or a methylene group.

Examples of the group represented by $R^{19}$ include a propyolactone group, a butyrolactone group, a valerolactone group, a norbornanelactone group, and the like.

Examples of the cyclic carbonate group represented by $R^{19}$ include an ethylene carbonate group, a 1,3-propylene carbonate group, a cyclopentene carbonate group, a cyclohexene carbonate group, a norbornene carbonate group, and the like.

Examples of the sultone group represented by $R^{19}$ include a propiosultone group, a butyrosultone group, a valerosultone group, a norbornanesultone group, and the like.

A norbornanelactone group and a butyrolactone group are preferable as the lactone group. An ethylene carbonate group is preferable as the cyclic carbonate group. A norbornanesultone group is preferable as the sultone group.

Examples of a substituent that may substitute the hydrocarbon group represented by $R^{17}$ and $R^{18}$ include a halogen atom, a hydroxyl group, a carboxyl group, a keto group, a sulfonamide group, an amino group, an amide group, a cyano group, an acetyl group, and the like.

Structural units represented by the following formulas (5-1) to (5-18) are preferable as the structural unit (III).

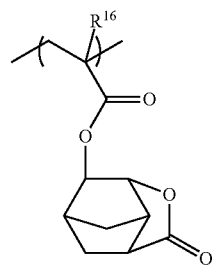
(5-1)

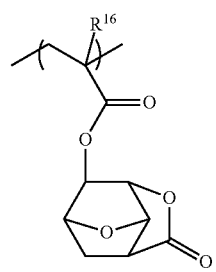
(5-2)

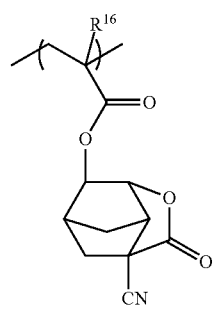
(5-3)

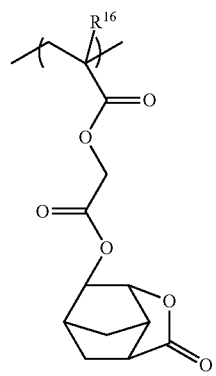
(5-4)

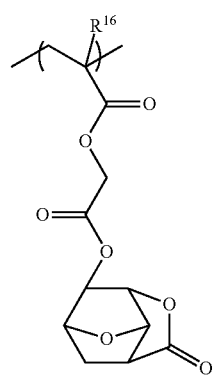
(5-5)

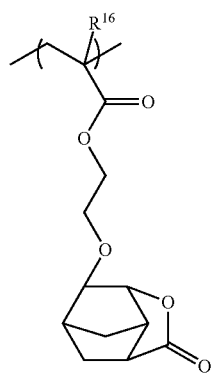
(5-6)
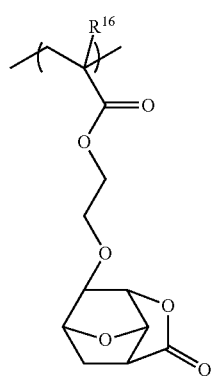
(5-7)
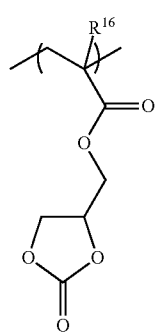
(5-8)
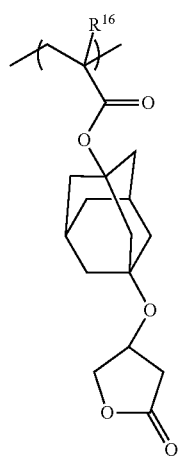
(5-9)
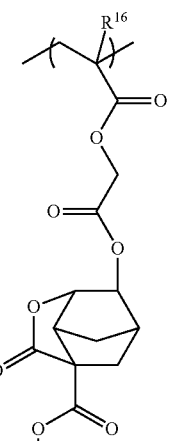
(5-10)
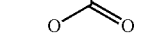
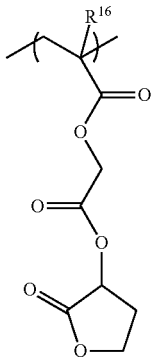
(5-11)
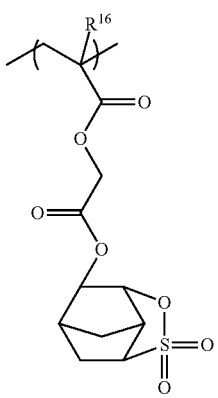
(5-12)
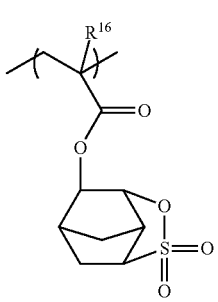
(5-13)

(5-14)
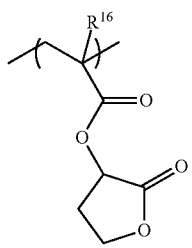

(5-15)
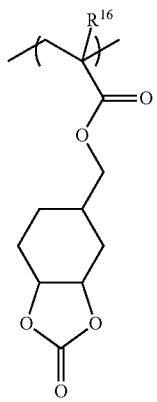

(5-16)
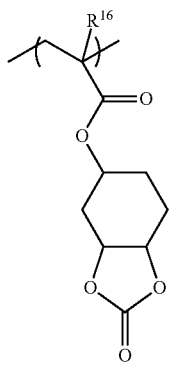

(5-17)
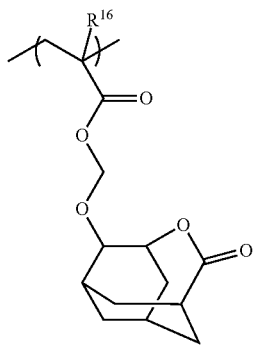

(5-18)
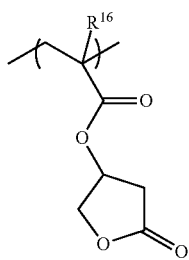

wherein $R^{16}$ is the same as defined for the formula (5).

Among these, the structural units represented by the formulas (5-1), (5-4), and (5-18) are more preferable since the lithographic performance of the photoresist composition is improved.

The content of the structural unit (III) in the polymer component [A] is preferably 0 to 80 mol %, and more preferably 20 to 70 mol %, based on the total structural units included in the polymer component [A]. When the content of the structural unit (III) is within the above range, lithographic performance (e.g., MEEF, DOF, and LWR) can be effectively improved.

When the polymer component [A] includes the structural unit (I) and the structural unit (III) in different polymers, it is preferable that the weight average molecular weight of a polymer (i) that includes the structural unit (I) be higher than the weight average molecular weight of a polymer (ii) that includes the structural unit (III). When the polymer component [A] includes the polymer (i) that includes the structural unit (I) and the polymer (ii) that includes the structural unit (III), and the weight average molecular weight of the polymer (i) is higher than the weight average molecular weight of the polymer (ii), the photoresist composition exhibits more excellent lithographic performance (e.g., MEEF and LWR).

The compounds represented by the following formulas are preferable as a compound that produces the structural unit (III).

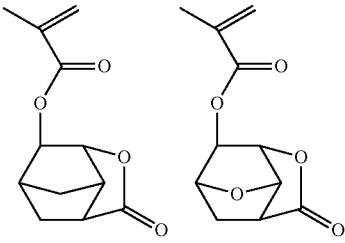

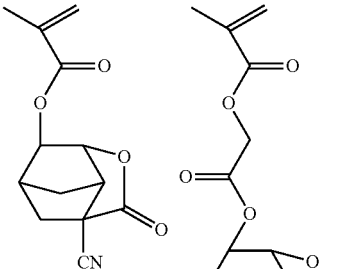

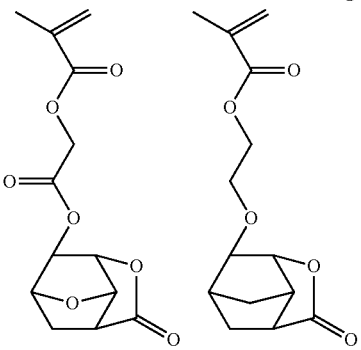

-continued

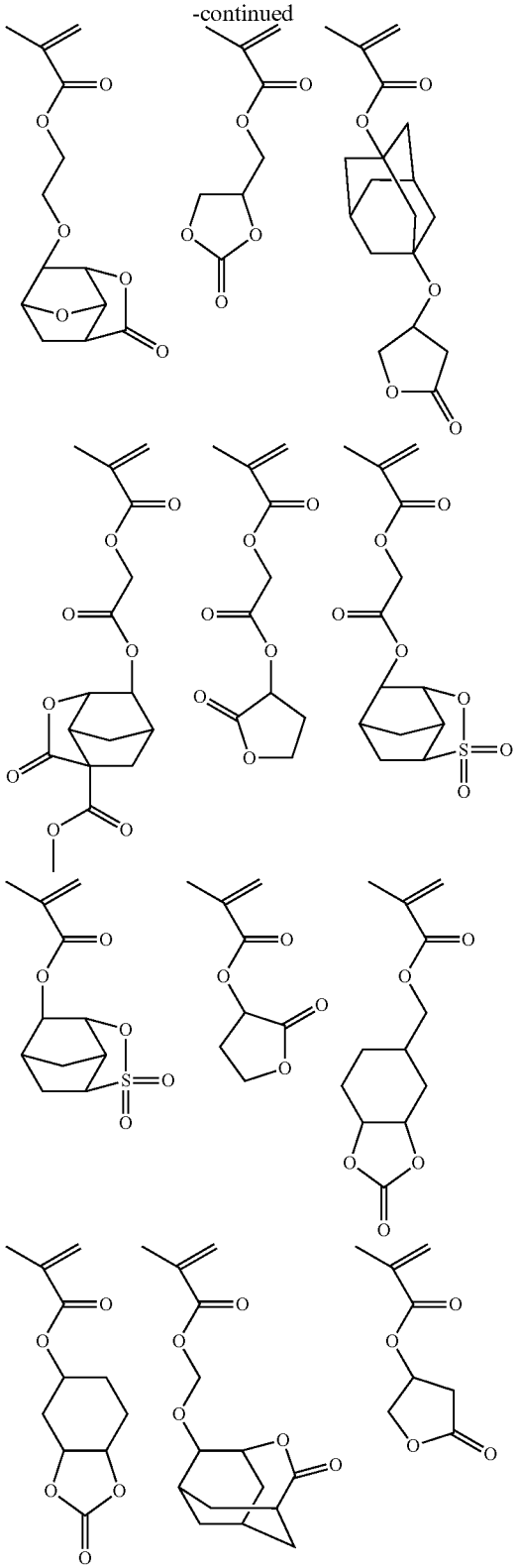

Structural Unit (IV)

The structural unit (IV) is a structural unit that does not fall under the structural unit (I) and includes a polar group. When the polymer component [A] further includes the structural unit (IV), the mutual solubility of the polymer component [A] and the compound [C] is improved, so that lithographic performance (e.g., MEEF, DOF, and LWR) can be further improved.

Examples of the polar group include a ketonic carbonyl group, a carboxyl group, an amide group, a urethane group, a urea group, a carbonate group, a sulfide group, a sulfonyl group, an alkyl halide group, a cyano group, a thiol group, and the like. Among these, a hydroxyl group, a sulfonyl group, and an alkyl halide group are preferable, and a hydroxyl group is more preferable.

Examples of the structural unit (IV) include structural units represented by the following formulas.

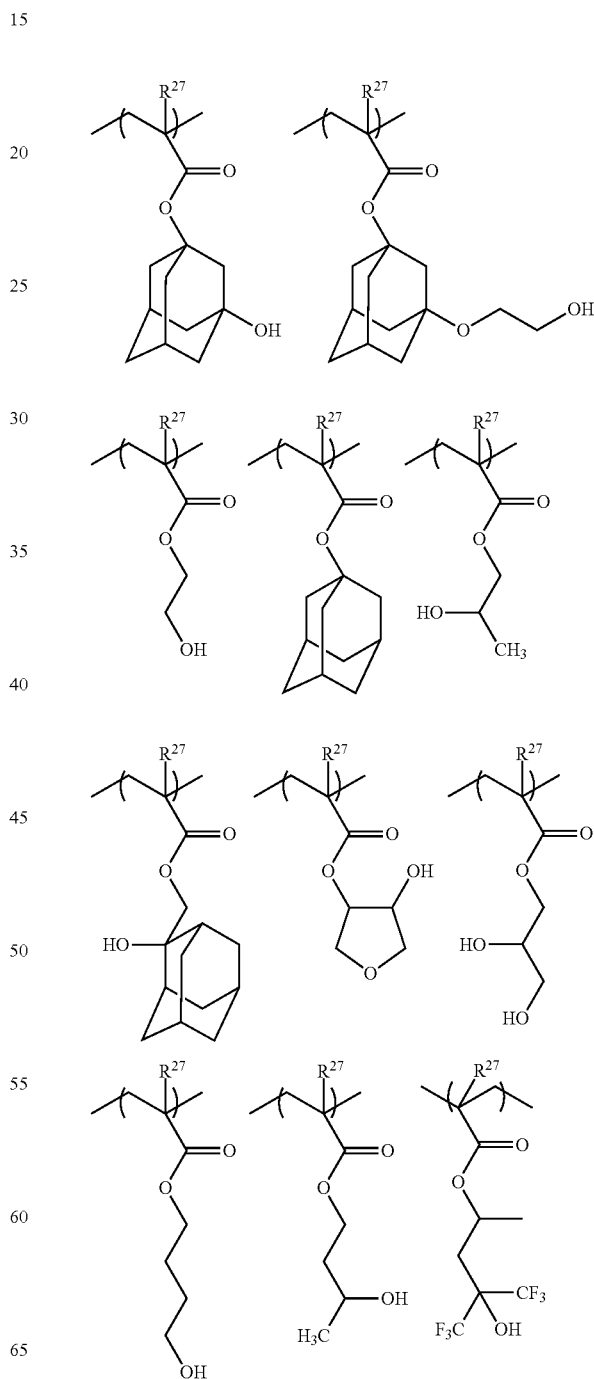

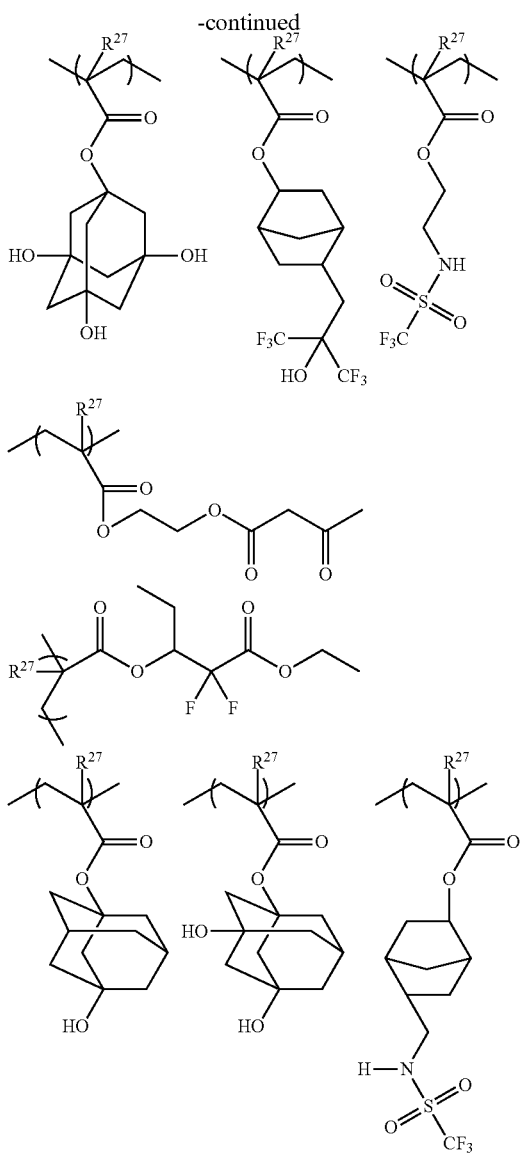

wherein $R^{27}$ is a hydrogen atom, a fluorine atom, a methyl group, or a trifluoromethyl group.

The content of the structural unit (IV) in the polymer component [A] is preferably 0 to 50 mol %, and more preferably 5 to 40 mol %, based on the total structural units included in the polymer component [A]. The polymer component [A] may include only one type of the structural unit (IV), or may include two or more types of the structural unit (IV).

Additional Structural Unit

The polymer component [A] may further include a structural unit (V) derived from a non-acid-labile compound as an additional structural unit. The term "non-acid-labile compound" used herein refers to a compound that does not include a group (acid-labile group) that dissociates due to an acid. When the polymer component [A] includes the structural unit (V), it is possible to form a resist pattern that exhibits more excellent lithographic properties.

Examples of the non-acid-labile compound for producing the structural unit (V) include styrene, α-methylstyrene, 4-methylstyrene, 2-methylstyrene, 3-methylstyrene, isobornyl acrylate, tricyclodecanyl(meth)acrylate, tetracyclododecenyl(meth)acrylate, and the like. Among these, styrene, α-methylstyrene, 4-methylstyrene, 2-methylstyrene, 3-methylstyrene, and tricyclodecanyl acrylate are preferable.

Synthesis of Polymer Component [A]

The polymer component [A] may be produced by polymerizing a monomer that produces each structural unit in an appropriate solvent using a radical initiator, for example. The polymer component [A] is preferably produced by adding a solution containing a monomer and a radical initiator dropwise to a reaction solvent or a solution containing a monomer to effect polymerization, or adding a solution containing a monomer and a solution containing a radical initiator dropwise to a reaction solvent or a solution containing a monomer to effect polymerization, or adding a plurality of solutions containing a different monomer and a solution containing a radical initiator dropwise to a reaction solvent or a solution containing a monomer to effect polymerization, for example.

The reaction temperature may be appropriately determined depending on the type of the initiator. The reaction temperature is normally 30 to 180° C., preferably 40 to 160° C., and more preferably 50 to 140° C. The dropwise addition time is determined depending on the reaction temperature, the type of initiator, the type of monomer, and the like, but is normally 30 minutes to 8 hours, preferably 45 minutes to 6 hours, and more preferably 1 to 5 hours. The total reaction time including the dropwise addition time is also determined depending on the reaction conditions, but is normally 30 minutes to 8 hours, preferably 45 minutes to 7 hours, and more preferably 1 to 6 hours.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis (2 methylpropionitrile), and the like. These initiators may be used either alone or in combination.

The polymerization solvent is not particularly limited as long as the polymerization solvent does not hinder polymerization (e.g., nitrobenzene has a polymerization inhibiting effect, and a mercapto compound has a chain transfer effect, which are undesirable), and can dissolve the monomer. Examples of the polymerization solvent include alcohol solvents, ketone solvents, amide solvents, ester/lactone solvents, nitrile solvents, mixed solvents thereof, and the like. These solvents may be used either alone or in combination.

A resin obtained by polymerization is preferably collected by re-precipitation. Specifically, the polymer solution is poured into a re-precipitation solvent after completion of polymerization to collect the target resin as a powder. An alcohol, an alkane, or the like may be used as the re-precipitation solvent either alone or in combination. The resin may also be collected by removing low-molecular-weight components (e.g., monomer and oligomer) by performing a separation operation, a column operation, an ultrafiltration operation, or the like.

When the polymer component [A] includes the structural unit (I), the structural unit (II), and the like in an identical polymer, the polymer component [A] may be produced by copolymerizing a monomer that produces the structural unit (I), a monomer that produces the structural unit (II), and the like using the above method. When the polymer component [A] includes the structural unit (I), the structural unit (II), and the like in different polymers, the polymer component [A] may be produced by polymerizing a monomer that produces each structural unit, and mixing the resulting polymers.

The polystyrene-reduced weight average molecular weight (Mw) of the polymer component [A] determined by gel permeation chromatography (GPC) is not particularly limited, but is preferably 1000 to 500,000, more preferably 2000 to 100,000, still more preferably 2500 to 30,000, and particularly preferably 2500 to 10,000. If the Mw of the polymer component [A] is less than 1000, the heat resistance of the resulting resist may deteriorate. If the Mw of the polymer component [A] exceeds 500,000, the developability of the resulting resist may deteriorate.

The ratio (Mw/Mn) of the Mw to the polystyrene-reduced number average molecular weight (Mn) of the polymer component [A] determined by GPC is normally 1 to 5, preferably 1 to 3, and more preferably 1 to 2. When the ratio (Mw/Mn) of the polymer component [A] is within the above range, the resulting resist film exhibits excellent resolution.

When the polymer component [A] includes the structural unit (I) and the structural unit (II) in different polymers, it is preferable that each polymer have an Mw and a ratio (Mw/Mn) within the above ranges.

Note that the terms "Mw" and "Mn" used herein refer to values measured by gel permeation chromatography (GPC) using GPC columns (manufactured by Tosoh Corporation, G2000HXL×2, G3000HXL×1, G4000HXL×1) at a flow rate of 1.0 ml/min and a column temperature of 40° C. (eluant: tetrahydrofuran, standard: monodisperse polystyrene).

Acid Generator [B]

The acid generator [B] is a compound that generates an acid upon exposure to light via a mask in an exposure step for forming a resist pattern. The acid generator [B] may be included in the photoresist composition as a compound (described below) and/or may be included in a polymer.

Examples of the acid generator [B] include onium salt compounds, N-sulfonyloxyimide compounds, halogen-containing compounds, diazoketone compounds, and the like. Among these, it is preferable to use an onium salt compound as the acid generator [B].

Examples of the onium salt compounds include sulfonium salts, tetrahydrothiophenium salts, iodonium salts, phosphonium salts, diazonium salts, pyridinium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylsulfonium 6-(adamantan-1-ylcarbonyloxy)-1,1,2,2-tetrafluorohexane-1-sulfonate, triphenylsulfonium 2-(adamantan-1-yl)-1,1-difluoroethanesulfonate, triphenylsulfonium 3-(4,7,7-trimethyl-2-oxa-3-oxobicyclo[2.2.1]heptan-1-ylcarbonyloxy)-1,1,2-propane-1-sulfonate, triphenylsulfonium 5-(2-norbornanelactonyloxycarbonylcyclohexane-1-ylcarbonyloxy)-1,1,2,2-tetrafluoropentane-1-sulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like.

Examples of the iodonium salts include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of sulfonyloxyimide compounds include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxyimide, and the like.

Among these, the onium salts are preferable, the sulfonium salts and the tetrahydrothiophenium salts are more preferable, and triphenylsulfonium 6-(adamantan-1-ylcarbonyloxy)-1,1,2,2-tetrafluoro hexane-1-sulfonate, triphenylsulfonium nonafluoro-n-butanesulfonate, triphenylsulfonium 2-(adamantan-1-yl)-1,1-difluoroethanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, triphenylsulfonium 3-(4,7,7-trimethyl-2-oxa-3-oxobicyclo[2.2.1]heptan-1-ylcarbonyloxy)-1,1,2-propane-1-sulfonate, triphenylsulfonium 5-(2-norbornanelactonyloxycarbonylcyclohexan-1-ylcarbonyloxy)-1,1,2,2-tetrafluoropentane-1-sulfonate, 1-(4-n-butoxynaphthalen-1-yl)tetrahydrothiophenium 4-(adamantan-1-ylcarbonyloxy)-1,1,2-trifluorobutane-1-sulfonate are still more preferable.

These acid generators [B] may be used either alone or in combination. The acid generator [B] is preferably used in an amount of 0.01 to 25 parts by mass, and more preferably 0.1 to 20 parts by mass, based on 100 parts by mass of the polymer component [A], in order to ensure that the photoresist composition exhibits improved sensitivity and lithographic performance.

Compound [C]

The compound [C] is a compound represented by the formula (3). When the photoresist composition includes the compound [C], the photoresist composition exhibits an acid strength adjustment function in the exposed area, exhibits an excellent acid-trapping function in the unexposed area, and exhibits an excellent acid diffusion control function in the exposed area due to inactivation of the acid-trapping function, so that lithographic performance (e.g., MEEF, LWR, and DOF) can be effectively improved.

In the formula (3), $R^{10}$ is a hydrogen atom or a monovalent organic group. $A^-$ is $-N^--SO_2-R^a$, $-COO^-$, $-O^-$, or $-SO_3^-$, provided that a fluorine atom is not bonded to a carbon atom bonded to $A^-$ when $A^-$ is $-SO_3^-$ and bonded to a carbon atom. $R^a$ is a linear or branched monovalent hydrocarbon group having 1 to 10 carbon atoms or a cyclic monovalent hydrocarbon group having 3 to 20 carbon atoms, provided that some or all of the hydrogen atoms of the hydrocarbon group may be substituted with a fluorine atom. $X^+$ is an onium cation.

Examples of the monovalent organic group represented by $R^{10}$ include an alkyl group having 1 to 20 carbon atoms, a cycloalkyl group having 3 to 20 carbon atoms, an aryl group having 6 to 30 carbon atoms, an aralkyl group having 7 to 30 carbon atoms, a heterocyclic group having 3 to 30 carbon atoms, a group that includes one or more groups among the above groups and one or more groups selected from the group consisting of $-O-$, $-CO-$, $-S-$, $-CS-$, and $-NH-$, and the like. Note that some or all of the hydrogen atoms of these groups may be substituted with a substituent. It is preferable that $R^{10}$ be bonded to $A^-$ via a carbon atom. In this case, it is preferable that the carbon atom not be bonded to an electron-withdrawing group (atom) so that the compound [C] functions as an acid that is relatively weaker than the acid generated by the acid generator [B].

Examples of a substituent that may substitute the alkyl group, the cycloalkyl group, the aryl group, the alkaryl group, and the heterocyclic group include a hydroxyl group, a halogen atom, an alkoxy group, a lactone group, an alkylcarbonyl group, and the like.

Examples of the linear or branched monovalent hydrocarbon group having 1 to 10 carbon atoms represented by $R^a$ include a methyl group, an ethyl group, a propyl group, a butyl group, and the like.

Examples of the cyclic monovalent hydrocarbon group having 3 to 20 carbon atoms represented by $R^a$ include a cyclopentyl group, a cyclohexyl group, a norbornyl group, an adamantyl group, and the like.

The onium cation represented by $X^+$ is preferably a sulfonium cation and/or an iodonium cation. The onium cation represented by $X^+$ is more preferably the sulfonium cation represented by the formula (4-1) and/or the iodonium cation represented by the formula (4-2).

When $X^+$ is the above onium cation, the dispersibility of the compound [C] in the resist film is improved, and it is possible to more accurately control diffusion of the acid generated by the acid generator [B] in the resist film. This makes it possible to further improve the lithographic performance (e.g., MEEF, LWR, and DOF) of the photoresist composition.

In the formulas (4-1) and (4-2), $R^{11}$ to $R^{15}$ are independently a hydroxyl group, a halogen atom, an alkyl group, a cycloalkyl group, an alkoxy group, $-S-R^A$, $-OSO_2-R^B$, or $-SO_2-R^C$. $R^A$ is an alkyl group or an aryl group. $R^B$ and $R^C$ are independently an alkyl group, a cycloalkyl group, an alkoxy group, or an aryl group, provided that some or all of the hydrogen atoms of the alkyl group, the cycloalkyl group, the alkoxy group, and the aryl group represented by $R^{11}$ to $R^{15}$, $R^A$, $R^B$, and $R^C$ may be substituted with a substituent. b, c, d, e, and f are independently an integer from 0 to 5, provided that a plurality of $R^{11}$ may be either identical or different when a plurality of $R^{11}$ are present, a plurality of $R^{12}$ may be either identical or different when a plurality of $R^{12}$ are present, a plurality of $R^{13}$ may be either identical or different when a plurality of $R^{13}$ are present, a plurality of $R^{14}$ may be either identical or different when a plurality of $R^{14}$ are present, and a plurality of $R^{15}$ may be either identical or different when a plurality of $R^{15}$ are present.

Examples of the halogen atom represented by $R^{11}$ to $R^{15}$ include a fluorine atom, a chlorine atom, a bromine atom, an iodine atom, and the like.

The alkyl group represented by $R^{11}$ to $R^{15}$ is preferably an alkyl group having 1 to 8 carbon atoms. Examples of the alkyl group having 1 to 8 carbon atoms include a methyl group, an ethyl group, a propyl group, a butyl group, and the like.

The cycloalkyl group represented by $R^{11}$ to $R^{15}$ is preferably a cycloalkyl group having 3 to 20 carbon atoms. Examples of the cycloalkyl group having 3 to 20 carbon atoms include a cyclopentyl group, a cyclohexyl group, a norbornyl group, an adamantyl group, and the like.

The alkoxy group represented by $R^{11}$ to $R^{15}$ is preferably an alkoxy group having 1 to 8 carbon atoms. Examples of the alkoxy group having 1 to 8 carbon atoms include a methoxy group, an ethoxy group, a propoxy group, a butoxy group, and the like.

The alkyl group represented by $R^A$ in $-S-R^A$ is preferably an alkyl group having 1 to 8 carbon atoms. Examples of the alkyl group having 1 to 8 carbon atoms include a methyl group, an ethyl group, a propyl group, a butyl group, and the like.

The aryl group represented by $R^A$ in $-S-R^A$ is preferably an aryl group having 6 to 20 carbon atoms. Examples of the aryl group having 6 to 20 carbon atoms include a phenyl group, a naphthyl group, and the like.

Examples of the alkyl group, the cycloalkyl group, and the alkoxy group represented by $R^B$ in $-OSO_2-R^B$ and $R^C$ in $-SO_2-R^C$ include those mentioned above in connection with $R^{11}$, $R^{12}$, and $R^{13}$. The aryl group represented by $R^B$ and $R^C$ is preferably an aryl group having 6 to 20 carbon atoms. Examples of the aryl group having 6 to 20 carbon atoms include a phenyl group, a naphthyl group, and the like.

Examples of a substituent that may substitute the alkyl group, the cycloalkyl group, the alkoxy group, and the aryl group represented by $R^{11}$ to $R^{15}$, $R^A$, $R^B$, and $R^C$ include a hydroxyl group, a halogen atom, an alkoxy group, an alkoxycarbonyl group, an alkoxycarbonyloxy group, and the like.

Examples of the sulfonium cation include the cations represented by the following formulas (i-1) to (i-13).

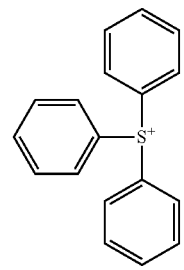

(i-1)

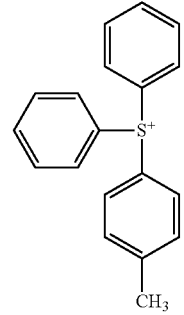

(i-2)

(i-3)
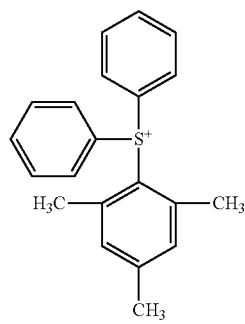
(i-4)
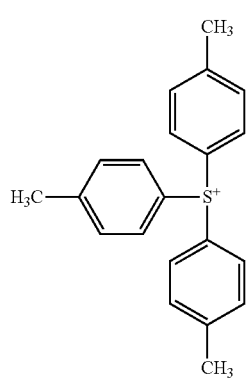
(i-5)
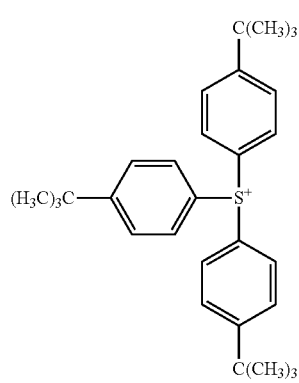
(i-6)
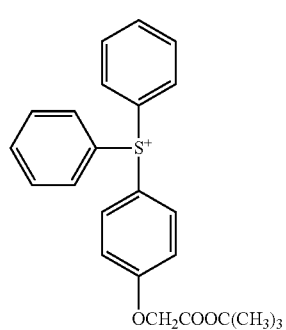
(i-7)
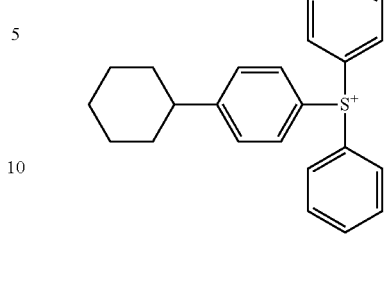
(i-8)
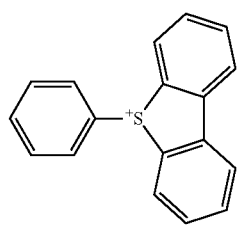
(i-9)
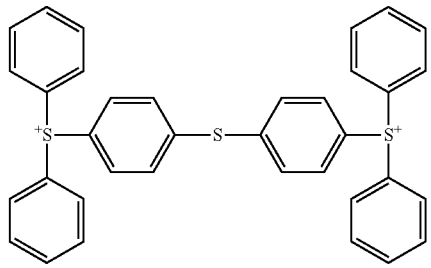
(i-10)
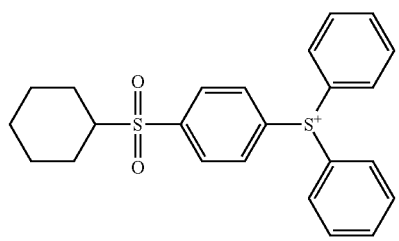
(i-11)
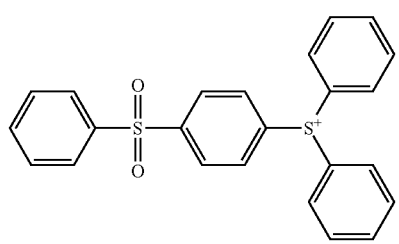

The compounds represented by the following formulas are preferable as the compound [C].
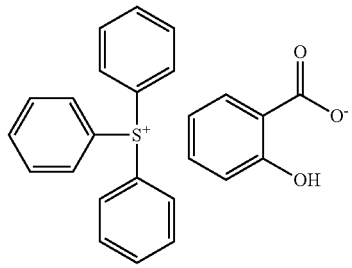
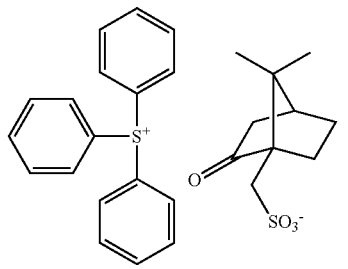
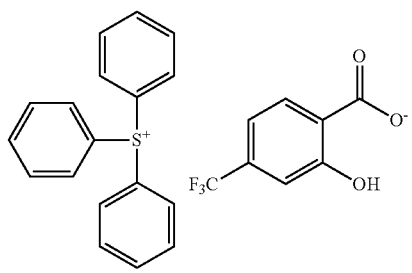
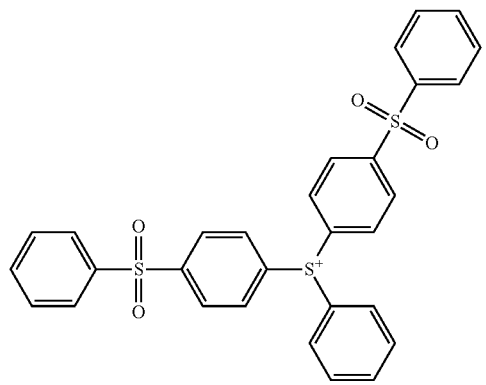
(i-12)
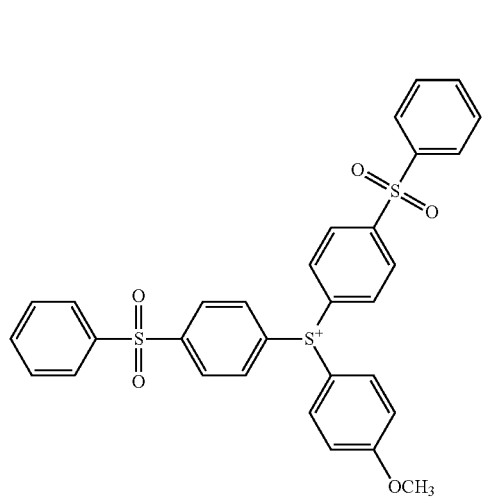
(i-13)
Examples of the iodonium cation include the cations represented by the following formulas (ii-1) to (ii-3).
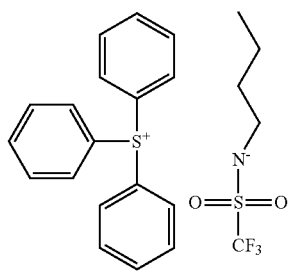
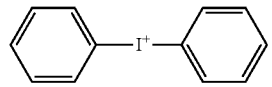
(ii-1)
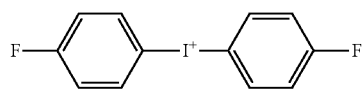
(ii-2)
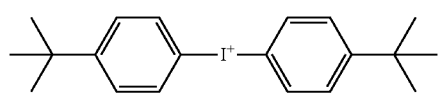
(ii-3)
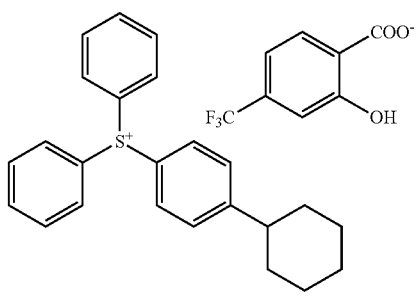
Among these, the sulfonium cation is preferable, and the cations represented by the formulas (i-1) and (i-10) are more preferable.

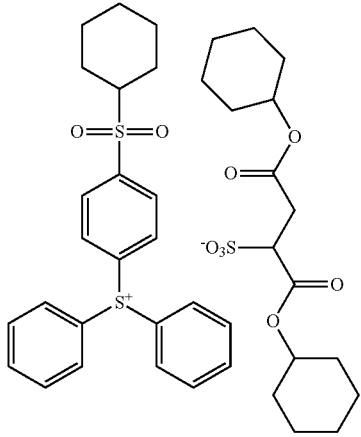
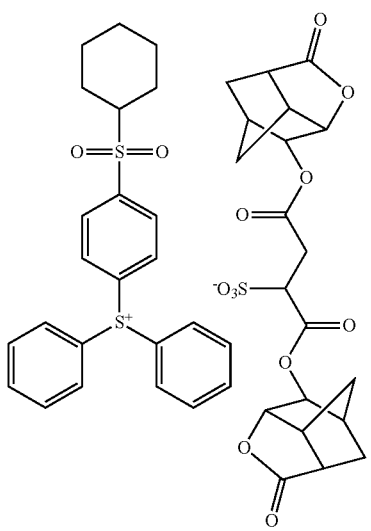
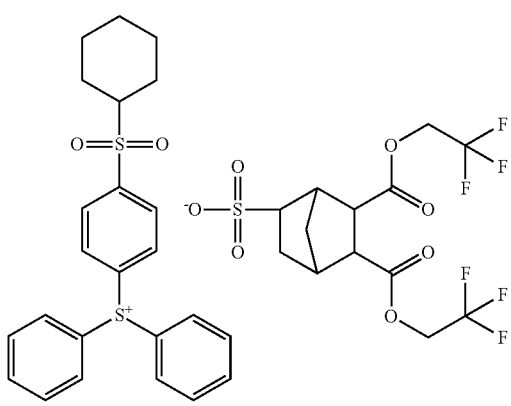
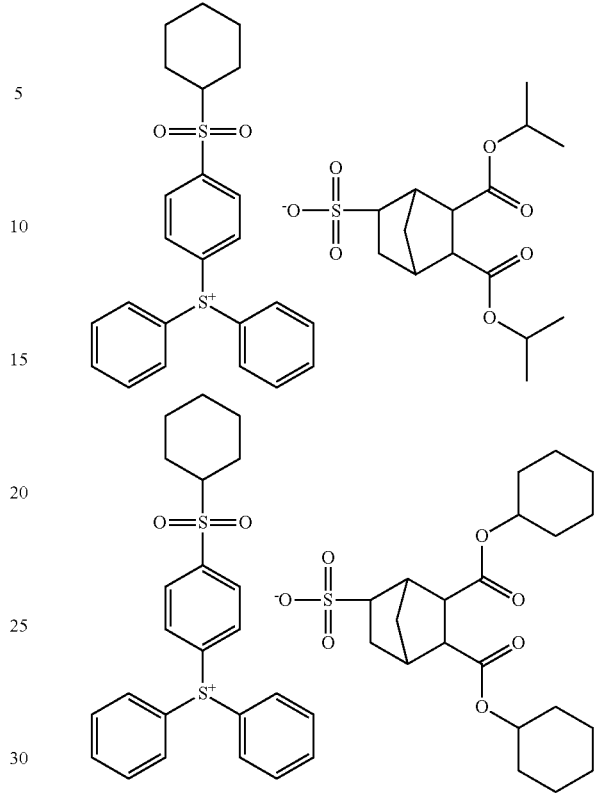

These compounds [C] may be used either alone or in combination. The compound [C] is preferably used in an amount of 0.1 to 45 parts by mass, and more preferably 1 to 35 parts by mass, based on 100 parts by mass of the polymer component [A]. If the amount of the compound [C] is less than 0.1 parts by mass, the performance (e.g., MEEF) of the resulting resist pattern may deteriorate. If the amount of the compound [C] exceeds 45 parts by mass, the photoresist composition may exhibit insufficient sensitivity.

The mass ratio of the compound [C] to the acid generator [B] in the photoresist composition is preferably 0.1 to 5, more preferably 0.2 to 3, and still more preferably 0.2 to 2. When the mass ratio of the compound [C] to the acid generator [B] is within the above range, the lithographic performance (e.g., MEEF, LWR, and DOF) of the photoresist composition can be improved.

Optional Component

Examples of an optional component that may be included in the photoresist composition include [D] an additive, [E] a solvent, [F] a fluorine-containing polymer, an alicyclic skeleton-containing compound, a surfactant, a sensitizer, and the like. Each optional component is described in detail below.

Additive [D]

The photoresist composition may include the additive [D] when forming a resist pattern by liquid immersion lithography. Examples of the additive [D] that may be included in the photoresist composition include γ-butyrolactone, propylene carbonate, and the like. Among these, γ-butyrolactone is preferable.

Solvent [E]

The photoresist composition normally includes the solvent [E]. The solvent that may be included in the photoresist composition is not particularly limited as long as the solvent can dissolve at least the polymer component [A], the acid generator [B], the compound [C], and the like. Examples of the solvent include alcohol-based solvents, ether-based solvents, ketone-based solvents, amide-based solvents, ester-based solvents, hydrocarbon-based solvents, and the like.

Examples of the alcohol-based solvents include monohydric alcohol-based solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethyl ether, dipropylene glycol monoethyl ether, and dipropylene glycol monopropyl ether; and the like.

Examples of the ether-based solvents include diethyl ether, dipropyl ether, dibutyl ether, diphenyl ether, and the like.

Examples of the ketone-based solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, methylcyclohexanone, 2,4-pentanedione, acetonylacetone, acetophenone, and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like.

Examples of the ester-based solvents include diethyl carbonate, methyl acetate, ethyl acetate, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of hydrocarbon-based solvents include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

These solvents [E] may be used either alone or in combination. The solvent [E] is preferably an ester-based solvent or a ketone-based solvent, more preferably a polyhydric alcohol partial ether acetate-based solvent or a cyclic ketone-based solvent, and still more preferably propylene glycol monomethyl ether acetate or cyclohexanone.

Fluorine-Containing Polymer [F]

The photoresist composition may further include the fluorine-containing polymer [F] (hereinafter may be referred to as "polymer [F]"). The polymer [F] includes a fluorine atom. It is preferable that the polymer [F] have a fluorine atom content higher than that of the polymer component [A]. When the photoresist composition includes the polymer [F], elution of a substance during liquid immersion lithography can be suppressed since the hydrophobicity of the resist film is improved. Moreover, since the receding contact angle of the resist film with an immersion medium can be sufficiently increased, water droplets do not remain when performing a high-speed scan, for example. Therefore, the photoresist composition can be suitably used for liquid immersion lithography.

Examples of the structure of the polymer [F] include a structure in which a fluoroalkyl group is bonded to the main chain, a structure in which a fluoroalkyl group is bonded to the side chain, a structure in which a fluoroalkyl group is bonded to the main chain and the main chain.

Examples of a monomer that produces a structure in which a fluoroalkyl group is bonded to the main chain include α-trifluoromethylacrylate compounds, β-trifluoromethylacrylate compounds, α,β-trifluoromethylacrylate compounds, compounds in which a hydrogen atom of at least one vinyl moiety is substituted with a fluoroalkyl group (e.g., trifluoromethyl group), and the like.

Examples of a monomer that produces a structure in which a fluoroalkyl group is bonded to the side chain include compounds obtained by substituting the side chain of an alicyclic olefin compound (e.g., norbornene) with a fluoroalkyl group or a group derived therefrom, ester compounds obtained by substituting the side chain of acrylic acid or methacrylic acid with a fluoroalkyl group or a group derived therefrom, compounds obtained by substituting the side chain (i.e., a moiety that does not include a double bond) of an olefin with a fluoroalkyl group or a group derived therefrom, and the like.

Examples of a monomer that produces a structure in which a fluoroalkyl group is bonded to the main chain and the main chain include ester compounds obtained by substituting the side chain of α-trifluoromethylacrylic acid, β-trifluoromethylacrylic acid, α,β-trifluoromethylacrylic acid, or the like with a fluoroalkyl group or a group derived therefrom, compounds obtained by substituting the side chain of a compound in which a hydrogen atom of at least one vinyl moiety is substituted with a fluoroalkyl group (e.g., trifluoromethyl group), with a fluoroalkyl group or a group derived therefrom, compounds obtained by substituting a hydrogen atom bonded to the double bond of an alicyclic olefin compound with a fluoroalkyl group (e.g., trifluoromethyl group), and substituting the side chain of the alicyclic olefin compound with a fluoroalkyl group or a group derived therefrom, and the like. Note that the term "alicyclic olefin compound" used herein refers to a compound that includes a double bond in its ring structure.

It is preferable that the polymer [F] include a structural unit (f1) represented by the following formula (6) and/or a structural unit (f2) represented by the following formula (7). The polymer [F] may include an additional structural unit other than the structural unit (f1) and the structural unit (f2). The content of the fluorine-containing structural unit in the polymer [F] is preferably 40 mol % or more, and more preferably 50 mol % or more. Each structural unit is described in detail below.

Structural Unit (f1)

The structural unit (f1) is represented by the following formula (6).

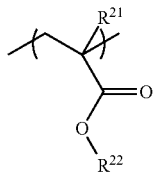

(6)

wherein $R^{21}$ is a hydrogen atom, a fluorine atom, a methyl group, or a trifluoromethyl group, and $R^{22}$ is a linear or branched alkyl group having 1 to 6 carbon atoms that includes a fluorine atom, or a monovalent alicyclic hydrocarbon group having 4 to 20 carbon atoms that includes a fluorine atom, provided that some or all of the hydrogen atoms of the alkyl group and the alicyclic hydrocarbon group may be substituted with a substituent.

Examples of a monomer that produces the structural unit (f1) include trifluoromethyl(meth)acrylate, 2,2,2-trifluoroethyl(meth)acrylate, perfluoroethyl(meth)acrylate, perfluoro-n-propyl(meth)acrylate, perfluoro-1-propyl(meth)acrylate, perfluoro-n-butyl(meth)acrylate, perfluoro-1-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro)pentyl(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like.

Examples of the structural unit (f1) include structural units represented by the following formulas (6-1) and (6-2).

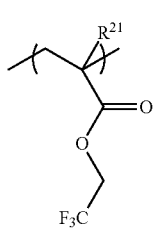

(6-1)

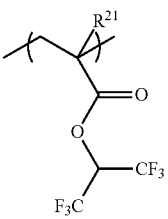

(6-2)

wherein $R^{21}$ is the same as defined for the formula (6).

The content of the structural unit (f1) in the polymer [F] is preferably 10 to 70 mol %, and more preferably 20 to 50 mol %, based on the total structural units included in the polymer [F]. The polymer [F] may include only one type of the structural unit (f1), or may include two or more types of the structural unit (f1).

Structural Unit (f2)

The structural unit (f2) is represented by the following formula (7).

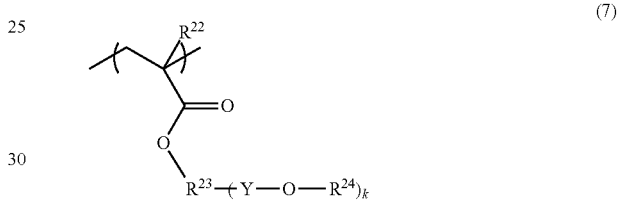

(7)

wherein $R^{22}$ is a hydrogen atom, a fluorine atom, a methyl group, or a trifluoromethyl group, $R^{23}$ is a (k+1)-valent linking group, Y is a divalent linking group that includes a fluorine atom, $R^{24}$ is a hydrogen atom or a monovalent organic group, and k is an integer from 1 to 3, provided that a plurality of Y may be either identical or different and a plurality of $R^{24}$ may be either identical or different when k is 2 or 3.

Examples of the structural unit (f2) include structural units represented by the following formulas (7-1) and (7-2).

(7-1)

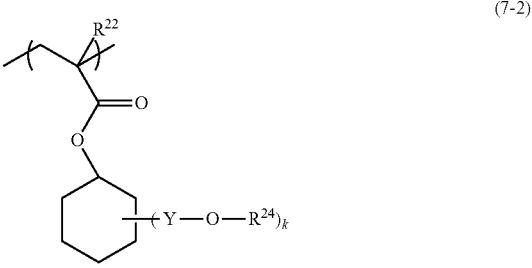

(7-2)

In the formula (7-1), $R^{25}$ is a linear, branched, or cyclic saturated or unsaturated divalent hydrocarbon group having 1 to 20 carbon atoms, and $R^{22}$, Y, and $R^{24}$ are the same as defined for the formula (7).

In the formula (7-2), $R^{22}$, Y, and $R^{24}$ are the same as defined for the formula (7), provided that a plurality of Y may be either identical or different and a plurality of $R^{24}$ may be either identical or different when k is 2 or 3.

Examples of the structural units represented by the formulas (7-1) and (7-2) include structural units represented by the following formulas (7-1), (7-1-2), and (7-2-1).

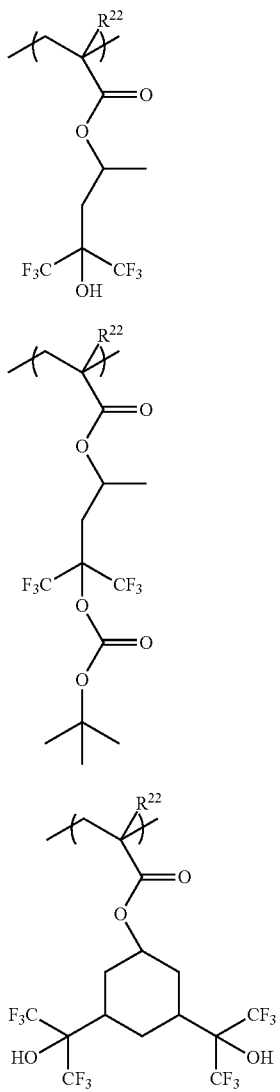

wherein $R^{22}$ is the same as defined for the formula (7).

Examples of a monomer that produces the repeating unit (f2) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl}(meth)acrylate, and the like.

The content of the structural unit (f2) in the polymer [F] is preferably 20 to 80 mol %, and more preferably 30 to 75 mol %, based on the total structural units included in the polymer [F]. The polymer [F] may include only one type of the structural unit (f2), or may include two or more types of the structural unit (f2).

The polymer [F] may further include one or more additional structural units such as a structural unit that includes a lactone structure, a cyclic carbonate structure, or a sultone structure and improves solubility in a developer, and a structural unit that includes an alicyclic structure and improves etching resistance.

Examples of the structural unit that includes a lactone structure, a cyclic carbonate structure, or a sultone structure include those mentioned above in connection with the structural unit (III) that may be included in the polymer component [A].

Examples of the structural unit that includes an alicyclic structure include a structural unit represented by the following formula (8).

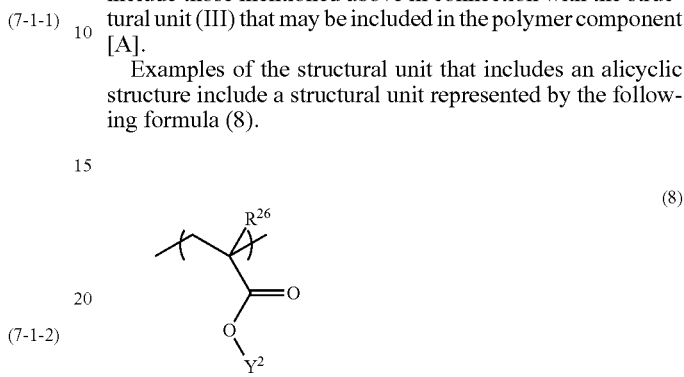

wherein $R^{26}$ is a hydrogen atom, a fluorine atom, a methyl group, or a trifluoromethyl group, and $Y^2$ is an alicyclic hydrocarbon group having 4 to 20 carbon atoms.

Examples of a monomer that produces the structural unit that includes an alicyclic structure include bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tricyclo[3.3.1.1$^{3,7}$]dec-1-yl(meth)acrylate, tricyclo[3.3.1.1$^{3,7}$]dec-2-yl(meth)acrylate, and the like.

The polymer [F] may include only one type of the additional structural unit, or may include two or more types of the additional structural unit. It is preferable that the polymer [F] does not include a unit that includes an aromatic group. In particular, a decrease in sensitivity may occur when using an ArF light source. Moreover, a deterioration in pattern shape may occur when implementing development using a negative-tone developer.

The polymer [F] is preferably used in an amount of 1 to 15 parts by mass, and more preferably 2 to 10 parts by mass, based on 100 parts by mass of the polymer component [A].

Synthesis of Polymer [F]

The polymer [F] may be produced by polymerizing a monomer that produces each structural unit in an appropriate solvent using a radical initiator, for example. Examples of the initiator, the solvent, and the like used to synthesize the polymer [F] include those mentioned above in connection with synthesis of the polymer component [A].

The reaction (polymerization) temperature is normally 40 to 150° C., and preferably 50 to 120° C. The reaction time is normally 1 to 48 hours, and preferably 1 to 24 hours.

The polystyrene-reduced weight average molecular weight (Mw) of the polymer [F] determined by gel permeation chromatography (GPC) is preferably 1000 to 50,000, more preferably 1000 to 30,000, and particularly preferably 1000 to 10,000. If the Mw of the polymer [F] is less than 1000, a sufficient receding contact angle may not be obtained. If the Mw of the polymer [F] exceeds 50,000, the resulting resist may exhibit insufficient developability.

The ratio (Mw/Mn) of the Mw to the polystyrene-reduced number average molecular weight (Mn) of the polymer [F] determined by GPC normally 1 to 3, and preferably 1 to 2.

Alicyclic Skeleton-containing Compound

The alicyclic skeleton-containing compound further improves dry etching resistance, a pattern shape, adhesion to a substrate, and the like. Examples of the alicyclic skeleton-containing compound include adamantane derivatives such as 1-adamantanecarboxylic acid, 2-adamantanone, and t-butyl 1-adamantanecarboxylate, deoxycholates such as t-butyl deoxycholate, t-butoxycarbonylmethyl deoxycholate, and 2-ethoxyethyl deoxycholate, lithocholates such as t-butyl lithocholate, t-butoxycarbonylmethyl lithocholate, and 2-ethoxyethyl lithocholate, 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxatricyclo[4.2.1.0$^{3,7}$] nonane, and the like.

Surfactant

The surfactant improves applicability, striation, developability, and the like.

Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

Sensitizer

The sensitizer absorbs the energy of radiation, and transmits the absorbed energy to the acid generator [B] to increase the amount of acid generated by the acid generator [B]. The sensitizer improves the apparent sensitivity of the photoresist composition. Examples of the sensitizer include carbazoles, acetophenones, benzophenones, naphthalenes, phenols, biacetyl, eosine, rose bengal, pyrenes, anthracenes, phenothiazines, and the like.

Preparation of Photoresist Composition

The photoresist composition may be prepared by mixing the polymer component [A], the acid generator [B], the compound [C], and an optional component in the solvent [E] in a given ratio, for example. The photoresist composition is normally prepared by dissolving the components in the solvent so that the total solid content is 1 to 30 mass %, and preferably 1.5 to 25 mass %, and filtering the solution through a filter having a pore size of about 0.2 μm, for example.

Resist Pattern-forming Method

The resist pattern-forming method that utilizes the photoresist composition includes (1) forming a resist film on a substrate using the photoresist composition (hereinafter may be referred to as "step (1)"), (2) exposing the resist film (hereinafter may be referred to as "step (2)"), and (3) developing the exposed resist film (hereinafter may be referred to as "step (3)"). Each step is described in detail below.

Step (1)

In the step (1), the resist film is formed on the substrate using the photoresist composition. A silicon wafer, an aluminum-coated wafer, or the like may be used as the substrate. An organic or inorganic antireflective film as disclosed in Japanese Patent Publication (KOKOKU) No. 6-12452, Japanese Patent Application Publication (KOKAI) No. 59-93448, or the like may be formed on the substrate.

The photoresist composition may be applied by spin coating, cast coating, roll coating, or the like. The thickness of the resist film is normally 10 to 1000 nm, and preferably 10 to 500 nm.

The resist film formed by applying the photoresist composition may optionally be soft-baked (SB) to vaporize the solvent from the resist film. The SB temperature is appropriately selected depending on the composition of the photoresist composition, but is normally about 30 to about 200° C., and preferably 50 to 150° C. The SB time is normally 5 to 600 seconds, and preferably 10 to 300 seconds.

Step (2)

In the step (2), the desired area of the resist film formed by the step (1) is subjected to reduced projection exposure via a mask having a specific pattern and an optional immersion liquid. For example, the desired area of the resist film may be subjected to reduced projection exposure via an isolated line pattern mask to form an isolated trench pattern. The resist film may be exposed two or more times. Examples of the immersion liquid used for exposure include water, a fluorine-containing inert liquid, and the like. It is preferable that the immersion liquid be a liquid that is transparent to the exposure wavelength and has a temperature coefficient of refractive index as small as possible so that distortion of an optical image projected onto the film is minimized. When using ArF excimer laser light (wavelength: 193 nm) as the exposure light, it is preferable to use water as the immersion liquid from the viewpoint of availability and ease of handling in addition to the above properties. When using water as the immersion liquid, a small amount of an additive that decreases the surface tension of water and increases the surface activity of water may be added to water. It is preferable that the additive does not dissolve the resist layer formed on the wafer, and does not affect the optical coating formed on the bottom surface of the lens. Distilled water is preferably used as the water.

The light used for exposure is appropriately selected from ultraviolet rays, deep ultraviolet rays, extreme ultraviolet (EUV) light, X-rays, charged particle rays, and the like depending on the type of the acid generator [B]. Among these, deep ultraviolet rays are preferable. It is more preferable to use ArF excimer laser light or KrF excimer laser light (wavelength: 248 nm). It is still more preferable to use ArF excimer laser light. The exposure conditions (e.g., dose) are appropriately selected depending on the composition of the photoresist composition, the type of additive, and the like.

In the step (2), it is preferable to perform post-exposure bake (PEB) after exposure. The acid-labile group included in the polymer component [A] and the like included in the photoresist composition dissociates smoothly due to PEB. The PEB temperature is normally 30° C. or more and less than 200° C., and preferably 50° C. or more and less than 150° C. If the PEB temperature is less than 30° C., the acid-labile group may not dissociate smoothly. If the PEB temperature is 200° C. or more, the acid generated by the acid generator [B] may be diffused in the unexposed area, and an excellent pattern may not be obtained.

Step (3)

In the step (3), the resist film that has been exposed and heated is developed using a developer. After development, the resist film is normally rinsed with water, and dried. An alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water is preferably used as the developer.

Examples of the development method include a dipping method that immerses the substrate in a container filled with the developer for a given time, a puddle method that allows the developer to be present on the surface of the substrate for a given time due to surface tension, a spray method that sprays the developer onto the surface of the substrate, a dynamic dispensing method that applies the developer to the substrate that is rotated at a constant speed while scanning with a developer application nozzle at a constant speed, and the like.

EXAMPLES

The invention is further described below by way of examples. Note that the invention is not limited to the following examples. The property values were measured by the following methods.

Measurement of Mw and Mn

The Mw and the Mn of the polymer were measured by gel permeation chromatography (GPC) under the following conditions.

Column: G2000HXL×2, G3000HXL×1, G4000HXL×1 (manufactured by Tosoh Corporation)

Eluant dimethylformamide (LiBr: 0.3 mass %, $H_3PO_4$: 0.1 mass %, mixed solution)

Column temperature: 40° C.

Flow rate: 1.0 ml/min

Concentration of sample: 0.2 mass %

Detector: differential refractometer

Standard: monodisperse polystyrene $^{13}$C-NMR Analysis

The structural unit derived from each monomer contained in the polymer was analyzed using a Fourier-transform nuclear magnetic resonance system "JNM-ECX400" (manufactured by JEOL Ltd.) (measuring solvent: deuterated chloroform). The content of each structural unit in the polymer may be determined by measuring the $^{13}$C-NMR spectrum of the polymer, and calculating the content of each structural unit as an average value from the area ratio of the peaks in the $^{13}$C-NMR spectrum corresponding to each structural unit.

Synthesis of Polymer

The monomers used to synthesize the polymer component [A] and the polymer [F] are shown below.

(M-1)

(M-2)

(M-3)

(M-7)

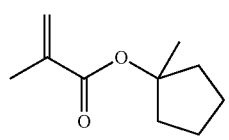
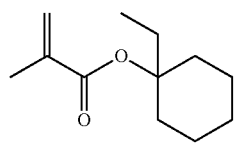
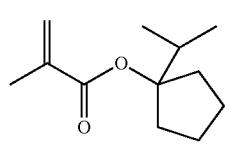
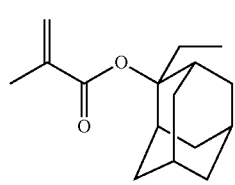

-continued (M-10)

(M-11)

(Ss-1)

(Ss-2)

(Ss-3)

(Ss-4)

(Ss-5)

(L-1)

(L-4)

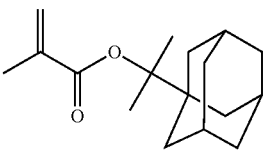
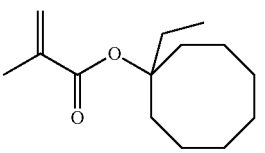
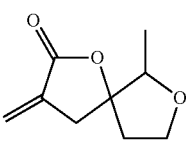
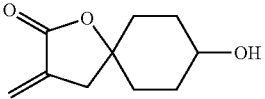
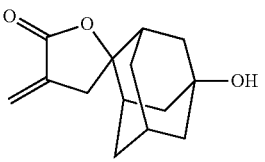
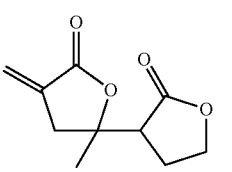
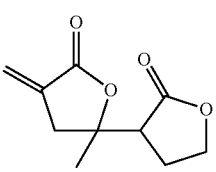
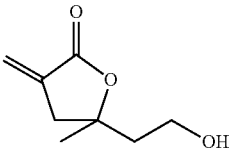
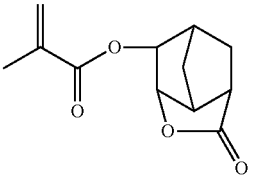

-continued

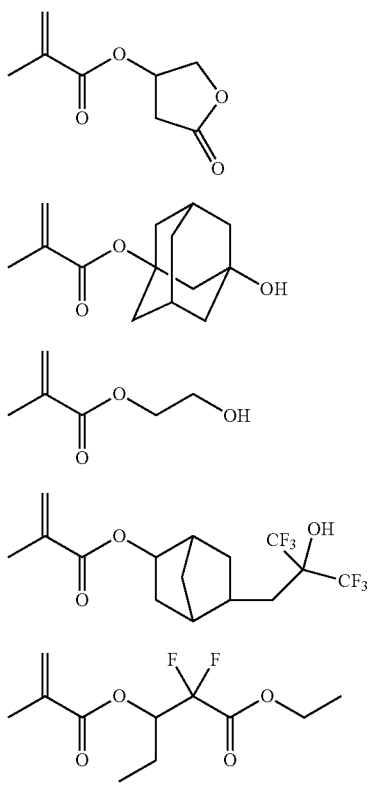

(L-15)

(X-1)

(X-4)

(X-5)

(X-8)

The compound represented by the formula (Ss-1) and the compound represented by the formula (Ss-2) that produce the structural unit (I) were synthesized by the following method.

Synthesis Example a

A three-necked reactor (1 l) that was equipped with a dropping funnel and a condenser and had been dried was charged with 13.1 g (200 mmol) of a zinc powder (special grade, manufactured by Wako Pure Chemical Industries, Ltd.). After replacing the atmosphere inside the reactor with argon, 240 ml of tetrahydrofuran (THF) was added to the reactor. After the addition of 1.9 ml (15 mmol) of chlorotrimethylsilane while stirring the mixture using a magnetic stirrer, the mixture was stirred at 20 to 25° C. for 30 minutes. A solution prepared by dissolving 20.0 g (200 mmol) of 2-methyltetrahydrofuran-3-one in 40 ml of THF was then added to the mixture. Next, a solution prepared by dissolving 34.8 g (180 mmol) of ethyl (2-bromomethyl)acrylate in 50 ml of THF was added dropwise to the mixture. After the addition, the mixture was stirred at room temperature for 2 hours. After confirming completion of the reaction by gas chromatography, an ammonium chloride aqueous solution and ethyl acetate were added to the mixture to effect separation. The resulting organic layer was sequentially washed with water and a saturated sodium chloride solution, dried over magnesium sulfate, and concentrated under reduced pressure. The concentrate was distilled under reduced pressure to obtain 20.4 g of 6-methyl-3-methylene-1,7-dioxaspiro[4.4]nonan-2-one (compound represented by the formula (Ss-1)) as a transparent oily product.

Synthesis Example b

A three-necked reactor (1000 ml) was charged with 22.4 g (200 mmol) of 1,4-cyclohexanedione. After the addition of 300 ml of methanol, the mixture was stirred using a magnetic stirrer to obtain a solution. After cooling the reactor to 0° C., a solution prepared by dissolving 2.65 g of sodium borohydride in methanol was added to the solution to effect a reaction. The mixture was then added to a saturated ammonium chloride aqueous solution, and extracted with ethyl acetate. The extract was dried under reduced pressure to obtain 12 g of a crude product. A three-necked reactor (300 ml) was charged with the crude product. After the addition of 100 ml of methylene chloride, the mixture was stirred using a magnetic stirrer to obtain a solution. After the addition of 15.5 g (227 mmol) of imidazole and 4.2 g (34 mmol) of dimethylaminopyridine, the reactor was cooled to 0° C. After the addition of 25.7 g (170 mmol) of t-butyldimethylsilyl chloride, the mixture was reacted at 0° C. for 2 hours, and then reacted at room temperature for 6 hours. An ammonium chloride aqueous solution was then added to the mixture to effect separation. The resulting organic layer was sequentially washed with water and a saturated sodium chloride solution, dried over magnesium sulfate, and concentrated under reduced pressure. The concentrate was purified using a short column to obtain 9.5 g of a crude product. A reaction using a zinc powder was then effected in the same manner as in Synthesis Example a to obtain 4.3 g of a crude product. After dissolving the crude product in 5 ml of tetrahydrofuran, 50 ml of a 1 mol/l tetrabutylammonium fluoride-THF solution was added to the solution. The mixture was reacted for 18 hours, and extracted with ethyl acetate. The extract was washed with water and a saturated sodium chloride solution, and purified by column chromatography to obtain 2.5 g (14 mmol) of the compound represented by the formula (Ss-2).

Synthesis of Polymer Component [A]

The polymer component [A] was synthesized by the following method using the compounds represented by the above formulas.

Synthesis Example 1

20 g (50 mol %) of the compound (M-1) and 20 g (50 mol %) of the compound (Ss-1) were dissolved in 80 g of 2-butanone, and 3.9 g of AIBN was added to the solution to prepare a monomer solution. A three-necked flask (200 ml) was charged with 40 g of 2-butanone, purged with nitrogen for 30 minutes, and heated to 80° C. with stirring. The monomer solution was added dropwise to the flask using a dropping funnel over 3 hours. The monomers were polymerized for 6 hours from the start of dropwise addition of the monomer solution. After completion of polymerization, the polymer solution was cooled with water to 30° C. or less. The polymer solution was then added to 800 g of methanol, and a white powder that precipitated by this operation was filtered off. The white powder was washed twice with 160 g of methanol, filtered off, and dried at 50° C. for 17 hours to obtain a white powdery polymer component (A-1) (30 g, yield: 75%). The polymer component (A-1) had an Mw of 4500 and a dispersity (Mw/Mn) of 1.4. It was found by $^{13}$C-NMR analysis that the content of structural units derived from the compound (M-1) and the content of structural units derived from the compound (Ss-1) in the polymer component (A-1) were 50 mol %, respectively.

Synthesis Examples 2 to 9

A polymer component [A] was produced in the same manner as in Synthesis Example 1, except that the types and the amounts of the monomers were changed as shown in Table 1. The Mw and the dispersity (Mw/Mn) of the resulting polymer component [A] are also shown in Table 1.

TABLE 1

| | Polymer component [A] | Compound | | Structural unit in polymer component | Property value | |
|---|---|---|---|---|---|---|
| | | Type | Amount (mol %) | Content (mol %) | Mw | Mw/Mn |
| Synthesis Example 1 | A-1 | M-1/Ss-1 | 50/50 | 50/50 | 4500 | 1.4 |
| Synthesis Example 2 | A-2 | M-2/Ss-2 | 70/30 | 72/28 | 4700 | 1.3 |
| Synthesis Example 3 | A-3 | M-7/Ss-3 | 50/50 | 52/48 | 5000 | 1.4 |
| Synthesis Example 4 | A-4 | M-3/M-10/Ss-4/L-1 | 40/10/10/40 | 42/11/10/37 | 4200 | 1.5 |
| Synthesis Example 5 | A-5 | M-1/X-1/Ss-5/L-4 | 30/20/20/30 | 32/22/18/28 | 4300 | 1.4 |
| Synthesis Example 6 | A-6 | M-1/X-4/Ss-1 | 45/10/45 | 46/9/45 | 4200 | 1.5 |
| Synthesis Example 7 | A-7 | M-7/X-5/Ss-2 | 50/30/20 | 50/31/19 | 4900 | 1.3 |
| Synthesis Example 8 | A-8 | M-1/Ss-1/L-15 | 35/5/60 | 34/5/61 | 5400 | 1.4 |
| Synthesis Example 9 | A-9 | M-10/Ss-1/L-15 | 25/15/60 | 26/14/60 | 5300 | 1.4 |

Synthesis of Polymer [F]

Synthesis Example 10

13.7 g (50 mol %) of the compound (M-7) and 16.3 g (50 mol %) of the compound (X-5) were dissolved in 60 g of 2-butanone, and 1.82 g of AIBN was added to the solution to prepare a monomer solution. A three-necked flask (300 ml) was charged with 30 g of 2-butanone, purged with nitrogen for 30 minutes, and heated to 80° C. with stirring. The monomer solution was added dropwise to the flask using a dropping funnel over 3 hours. The monomers were polymerized for 6 hours from the start of dropwise addition of the monomer solution. After completion of polymerization, the polymer solution was cooled with water to 30° C. or less. The polymer solution was added to 600 g of a methanol-water solution (=8:2), and a white powder that precipitated by this operation was filtered off. The white powder was washed twice with 120 g of methanol, filtered off, and dried at 50° C. for 17 hours to obtain a white powdery polymer (F-1) (24 g, yield: 80%). The polymer (F-1) had an Mw of 4100 and a dispersity (Mw/Mn) of 1.4. It was found by $^{13}$C-NMR analysis that the content of structural units derived from the compound (M-7) and the content of structural units derived from the compound (X-5) in the polymer (F-1) were 48.5 mol % and 51.5 mol %, respectively.

Synthesis Examples 11 and 12

A polymer (F-2) or (F-3) was produced in the same manner as in Synthesis Example 10, except that the types and the amounts of the monomers were changed as shown in Table 2. The Mw and the dispersity (Mw/Mn) of the resulting polymer are also shown in Table 2.

Preparation of Photoresist Composition

The acid generator [B], the compound [C], the additive [D], and the solvent [E] used to prepare the photoresist composition are shown below.

Acid Generator [B]

B-1 to B-7: compounds represented by the following formulas

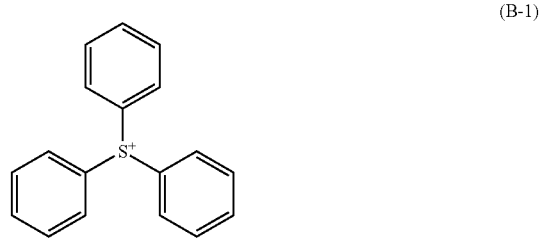

(B-1)

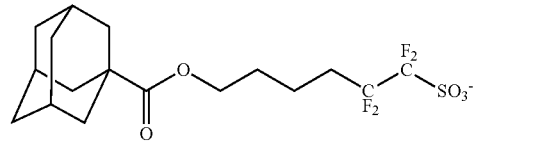

(B-2)

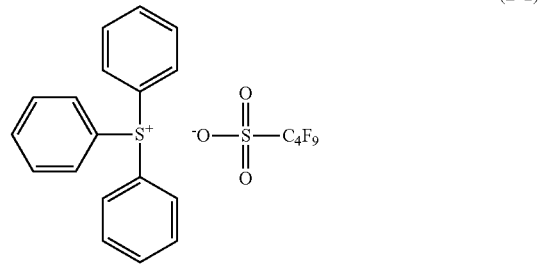

TABLE 2

| | Polymer [F] | Compound | | Structural unit in polymer component | Property value | |
|---|---|---|---|---|---|---|
| | | Type | Amount (mol %) | Content (mol %) | Mw | Mw/Mn |
| Synthesis Example 10 | F-1 | M-7/X-5 | 50/50 | 48.5/51.5 | 4100 | 1.4 |
| Synthesis Example 11 | F-2 | M-2/X-8 | 30/70 | 33/67 | 4200 | 1.3 |
| Synthesis Example 12 | F-3 | M-11/X-8 | 40/60 | 41/59 | 4800 | 1.4 |

(B-3)
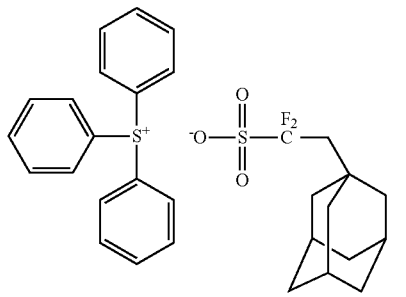
(B-7)
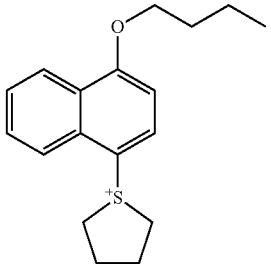
(B-4)
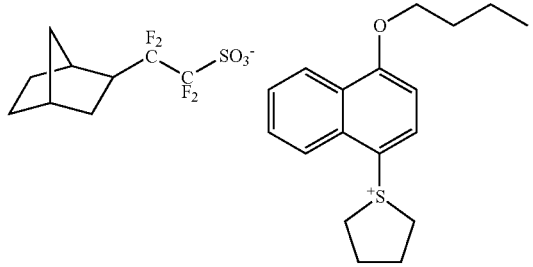
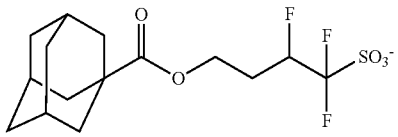
(B-5)
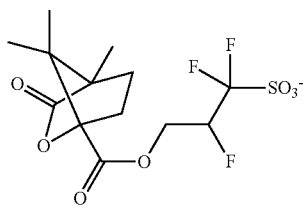
Compound [C]
C-1 to C-8: compounds represented by the following formulas
(C-1)
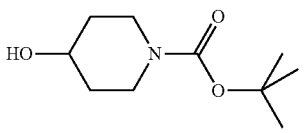
(C-2)
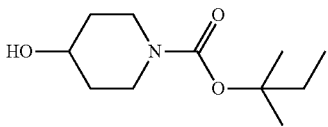
(B-6)
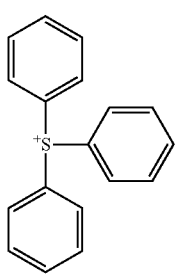
(C-3)
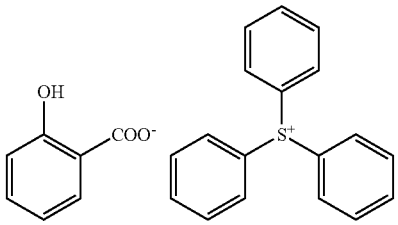
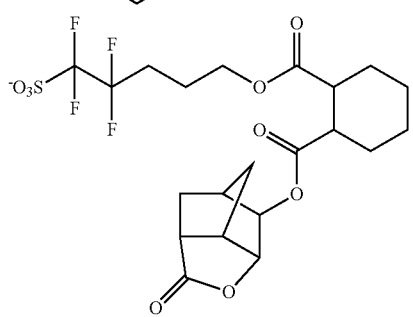
(C-4)
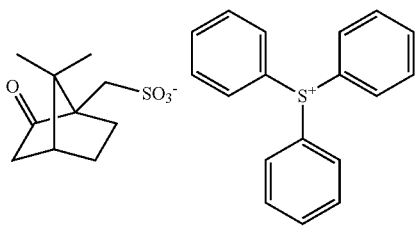

(C-5)
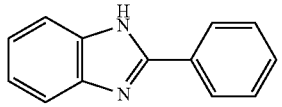

(C-6)
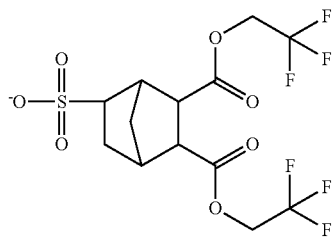

(C-7)
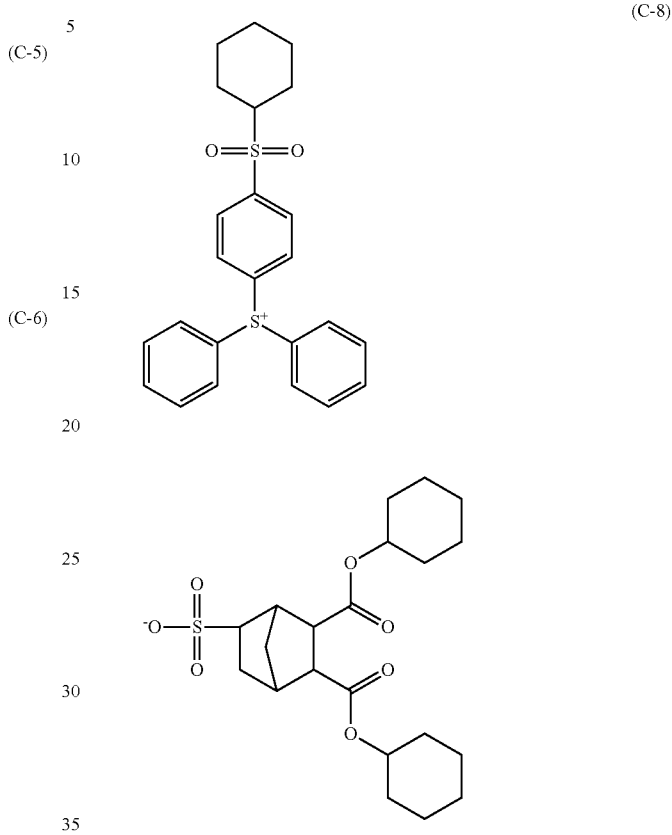

Additive [D]
D-1: γ-butyrolactone
Solvent [E]
E-1: propylene glycol monomethyl ether acetate
E-2: cyclohexanone Example 1

100 parts by mass of the polymer component (A-1) (polymer component [A]), 10 parts by mass of the acid generator (B-1) (acid generator [B]), 5 parts by mass of the compound (C-3) (compound [C]), 3 parts by mass of the polymer (F-1) (polymer [F]), 30 parts by mass of the additive (D-1) (additive [D]), 2600 parts by mass of the solvent (E-1) (solvent [E]), and 1100 parts by mass of the solvent (E-2) (solvent [E]) were mixed. The resulting solution was filtered through a filter having a pore size of 0.2 μm to prepare a photoresist composition.

Examples 2 to 9 and Comparative Examples 1 to 3

A photoresist composition was prepared in the same manner as in Example 1, except that the type and the amount of each component were changed as shown in Table 3. Note that the type and the amount of each solvent [E] were the same as in Example 1.

TABLE 3

| | Polymer component [A] | | Acid generator [B] | | Compound [C] | | Additive [D] | | Polymer [F] | | SB temp. (°C.) | PEB temp. (°C.) | Sensitivity (mJ/cm$^2$) | LWR (nm) | MEEF | DOF (nm) |
|---|---|---|---|---|---|---|---|---|---|---|---|---|---|---|---|---|
| | Type | Parts by mass | Type | Parts by mass | Type | Parts by mass | Type | Parts by mass | Type | Parts by mass | | | | | | |
| Example 1 | A-1 | 100 | B-1 | 10 | C-3 | 5 | D-1 | 30 | F-1 | 3 | 120 | 105 | 35 | 5.2 | 3.2 | 200 |
| Example 2 | A-2 | 100 | B-1 | 9 | C-3 | 6 | D-1 | 100 | F-2 | 4 | 120 | 100 | 39 | 5.3 | 3.3 | 180 |
| Example 3 | A-3 | 100 | B-7 | 10 | C-3 | 5 | D-1 | 30 | F-1 | 4 | 120 | 85 | 40 | 5.3 | 3.2 | 180 |
| Example 4 | A-4 | 100 | B-1 | 10 | C-4 | 4 | D-1 | 200 | F-3 | 4 | 120 | 80 | 39 | 5.2 | 3.4 | 170 |
| Example 5 | A-5 | 100 | B-4 | 10 | C-3/C-8 | 3/3 | D-1 | 30 | F-1 | 4 | 120 | 105 | 38 | 5.3 | 3.2 | 170 |
| Example 6 | A-6 | 100 | B-2/B-3 | 6/6 | C-3 | 6 | D-1 | 30 | F-1 | 3 | 120 | 105 | 35 | 5.1 | 3.3 | 170 |
| Example 7 | A-7 | 100 | B-2 | 11 | C-3 | 6 | D-1 | 100 | F-2 | 3 | 120 | 85 | 38 | 5.4 | 3.3 | 180 |
| Example 8 | A-8 | 100 | B-1/B-5 | 10 | C-2/C-7 | 5/2 | D-1 | 30 | F-1 | 4 | 100 | 90 | 38 | 5.2 | 3.3 | 200 |
| Example 9 | A-9 | 100 | B-1/B-6 | 5/9 | C-2/C-6 | 7/1 | D-1 | 30 | F-1 | 4 | 110 | 90 | 39 | 5.2 | 3.2 | 190 |
| Comparative Example 1 | A-1 | 100 | B-1 | 10 | C-1 | 5 | D-1 | 30 | F-1 | 3 | 120 | 105 | 39 | 6.2 | 3.8 | 120 |
| Comparative Example 2 | A-4 | 100 | B-1 | 10 | C-2 | 4 | D-1 | 200 | F-3 | 4 | 120 | 80 | 39 | 6.3 | 4.0 | 130 |
| Comparative Example 3 | A-6 | 100 | B-2/B-3 | 6/6 | C-5 | 6 | D-1 | 30 | F-1 | 3 | 120 | 105 | 35 | 6.4 | 3.9 | 120 |

Formation of Resist Pattern

The photoresist composition was applied to a 12-inch silicon wafer on which an underlayer antireflective film ("ARC66" manufactured by Nissan Chemical Industries, Ltd.) was formed, and soft-baked (SB) at 120° C. for 60 seconds to form a resist film having a thickness of 75 nm. The resist film was exposed via a mask pattern for forming a 50 nm line/100 nm pitch pattern using an ArF immersion scanner ("NSR S610C" manufactured by Nikon Corporation) (NA=1.3, ratio=0.800, Annular). The exposed resist film was subjected to PEB for 60 seconds at the temperature shown in Table 3. The resist film was then developed using a 2.38 mass % tetramethylammonium hydroxide aqueous solution, rinsed with water, and dried to form a positive-tone resist pattern. A dose at which the area exposed via the mask pattern for forming a 50 nm line/100 nm pitch pattern formed a line having a line width of 50 nm was determined to be an optimum dose (Eop).

Evaluation

The photoresist composition was evaluated as described below by performing measurement using the resist pattern that was formed as described above. The measurement was performed using a scanning electron microscope ("CG4000" manufactured by Hitachi High-Technologies Corporation). The evaluation results are shown in Table 3.

Sensitivity

The optimum dose (Eop) was evaluated as the sensitivity (mJ/cm$^2$). A case where the sensitivity was 40 mJ/cm$^2$ or less was evaluated as acceptable.

MEEF

An LS pattern was formed at the optimum dose (Eop) using a mask pattern for forming a 48 nm line/100 nm pitch pattern, a 49 nm line/100 nm pitch pattern, a 50 nm line/100 nm pitch pattern, a 51 nm line/100 nm pitch pattern, or a 52 nm line/100 nm pitch pattern. A graph was drawn by plotting the mask line size (nm) (horizontal axis) and the line width (nm) of the resist film formed using each mask pattern (vertical axis), and the slope of the straight line of the graph was calculated to be the MEEF. The MEEF (i.e., the slope of the straight line) becomes closer to 1 as the mask reproducibility increases.

LWR (nm)

The 50 nm line/100 nm pitch pattern formed at the optimum dose (Eop) was observed from above using a scanning electron microscope ("S4000" manufactured by Hitachi Ltd.), and the line width was measured at an arbitrary 10 points. The 3sigma value (variation) of the line width measured values was evaluated as the LWR (nm). It was determined that an excellent pattern shape was obtained when the LWR was 5.4 nm or less.

DOF (nm)

A focus amplitude when the pattern dimensions resolved at the optimum dose (Eop) using a 50 nm line/100 nm pitch pattern mask were within ±10% of the design dimensions of the mask was taken as the DOF (nm).

As shown in Table 3, it was confirmed that the photoresist composition according to the embodiments of the invention exhibited excellent lithographic performance (e.g., MEEF, DOF, and LWR).

Since the photoresist composition according to the embodiments of the invention includes the polymer component [A] that includes the structural unit (I) that includes the specific lactone structure and the structural unit (II) that includes an acid-labile group, and the compound [C], the photoresist composition exhibits satisfactory basic properties (e.g., sensitivity), and exhibits excellent lithographic performance (e.g., MEEF, LWR, and DOF). Therefore, the photoresist composition may suitably be used for lithography for which a further reduction in line width will be desired.

Obviously, numerous modifications and variations of the invention are possible in light of the above teachings. It is therefore to be understood that within the scope of the appended claims, the invention may be practiced otherwise than as specifically described herein.

What is claimed is:

1. A photoresist composition comprising:
    a polymer component that comprises a first structural unit represented by formula (1) and a second structural unit represented by formula (2), the first structural unit and the second structural unit being included in an identical polymer, or included in different polymers;
    an acid generator; and a compound represented by formula (3),

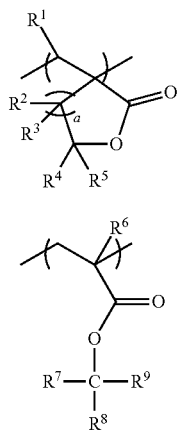

wherein
- $R^1$ is a hydrogen atom, a fluorine atom, a hydroxyl group, or a monovalent organic group having 1 to 20 carbon atoms,
- $R^2$ and $R^3$ are each independently a hydrogen atom, a fluorine atom, a hydroxyl group, or a monovalent organic group having 1 to 20 carbon atoms, or taken together represent a cyclic structure having 3 to 10 carbon atoms together with the carbon atom bonded to $R^2$ and $R^3$, a is an integer from 1 to 6, provided that a plurality of $R^2$ are either identical or different and a plurality of $R^3$ are either identical or different when a is an integer equal to or larger than 2,
- $R^4$ and $R^5$ are each independently a hydrogen atom, a fluorine atom, a hydroxyl group, or a monovalent organic group having 1 to 20 carbon atoms, wherein at least one of $R^4$ and $R^5$ is an alicyclic hydrocarbon group having 3 to 20 carbon atoms, an aromatic hydrocarbon group having 6 to 20 carbon atoms, or a heterocyclic group having 3 to 10 nucleus atoms, or $R^4$ and $R^5$ taken together represent a heterocyclic group having 3 to 10 carbon atoms together with the carbon atom bonded to $R^4$ and $R^5$, provided that some or all of hydrogen atoms of the alicyclic hydrocarbon group or the aromatic hydrocarbon group represented by the at least one of $R^4$ and $R^5$ are substituted with a halogen atom, a cyano group, a carboxyl group, a hydroxyl group, a thiol group, or that some or all of hydrogen atoms of the heterocyclic group represented by $R^4$ and $R^5$ are substituted with a substituent or unsubstituted,
- $R^6$ is a hydrogen atom, a fluorine atom, a methyl group, or a trifluoromethyl group,
- $R^7$ and $R^8$ are each independently an alkyl group having 1 to 4 carbon atoms or an alicyclic group having 4 to 20 carbon atoms, or taken together represent a divalent alicyclic group together with the carbon atom bonded to $R^7$ and $R^8$, and
- $R^9$ is an alkyl group having 1 to 4 carbon atoms or an alicyclic group having 4 to 20 carbon atoms, provided that some or all of hydrogen atoms of the alkyl group or the alicyclic group represented by $R^9$ are substituted with a substituent or unsubstituted, $$R^{10}-A^- \quad X^+ \qquad (3)$$

wherein
- $R^{10}$ is a hydrogen atom or a monovalent organic group,
- $A^-$ is $-N^--SO_2-R^a$, $-COO^-$, $-O^-$, or $-SO_3^-$, provided that a fluorine atom is not bonded to a carbon atom bonded to $A^-$ when $A^-$ is $-SO_3^-$ and bonded to a carbon atom, $R^a$ is a linear or branched monovalent hydrocarbon group having 1 to 10 carbon atoms or a cyclic monovalent hydrocarbon group having 3 to 20 carbon atoms, provided that some or all of hydrogen atoms of the hydrocarbon group represented by $R^a$ are substituted with a fluorine atom or unsubstituted, and
- $X^+$ is an onium cation.

2. The photoresist composition according to claim 1, wherein $X^+$ in the formula (3) is an onium cation represented by formula (4-1), an onium cation represented by formula (4-2), or a combination thereof,

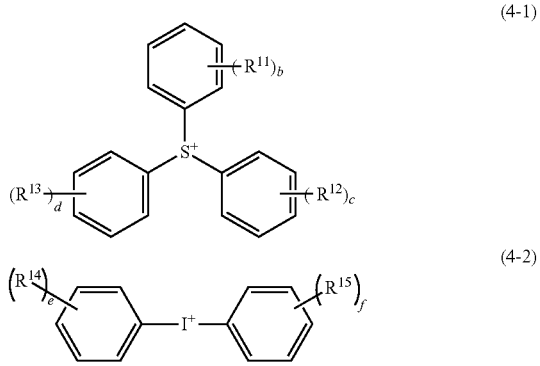

wherein $R^{11}$ to $R^{15}$ are each independently a hydroxyl group, a halogen atom, an alkyl group, a cycloalkyl group, an alkoxy group, $-S-R^A$, $-OSO_2-R^B$, or $-SO_2-R^C$, $R^A$ is an alkyl group or an aryl group, $R^B$ and $R^C$ are each independently an alkyl group, a cycloalkyl group, an alkoxy group, or an aryl group, provided that some or all of hydrogen atoms of the alkyl group, the cycloalkyl group, the alkoxy group, or the aryl group represented by $R^{11}$, $R^{12}$, $R^{13}$, $R^{14}$, $R^{15}$, $R^A$, $R^B$, or $R^C$ are substituted with a substituent or unsubstituted, b, c, d, e, and f are each independently an integer from 0 to 5, provided that a plurality of $R^{11}$ are either identical or different when a plurality of $R^{11}$ are present, a plurality of $R^{12}$ are either identical or different when a plurality of $R^{12}$ are present, a plurality of $R^{13}$ are either identical or different when a plurality of $R^{13}$ are present, a plurality of $R^{14}$ are either identical or different when a plurality of $R^{14}$ are present, and a plurality of $R^{15}$ are either identical or different when a plurality of $R^{15}$ are present.

3. The photoresist composition according to claim 1, wherein the polymer component further comprises a lactone group, a cyclic carbonate group, a sultone group, or a combination thereof.

4. The photoresist composition according to claim 3, wherein the lactone group, the cyclic carbonate group, the sultone group, or the combination thereof included in the polymer component is included in a third structural unit other than the first structural unit and the second structural unit.

5. The photoresist composition according to claim 4, wherein the third structural unit is represented by formula (5),

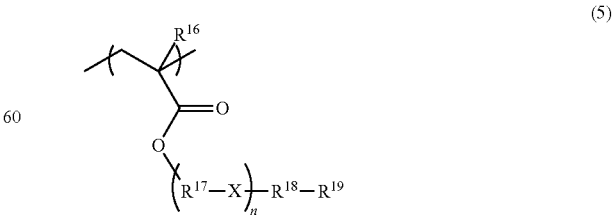

wherein $R^{16}$ is a hydrogen atom, a fluorine atom, a methyl group, or a trifluoromethyl group, $R^{17}$ is a hydrocarbon group having 1 to 10 carbon atoms, X is $-O-$, $-COO-$, —OCO—, or —NH—, n is an integer from 0 to 10, provided that a plurality of $R^{17}$ are either identical or different and a plurality of X are either identical or different when n is an integer equal to or larger than 2, $R^{18}$ is a single bond or a hydrocarbon group having 1 to 5 carbon atoms, provided that some or all of hydrogen atoms of the hydrocarbon group represented by $R^{17}$ or $R^{18}$ are substituted with a substituent or unsubstituted, and $R^{19}$ is a lactone group, a cyclic carbonate group, or a sultone group.

6. The photoresist composition according to claim 3, wherein the lactone group, the cyclic carbonate group, the sultone group, or the combination thereof included in the polymer component is included in the first structural unit.

7. The photoresist composition according to claim 3, wherein the lactone group is a norbornanelactone group or a butyrolactone group, the cyclic carbonate group is an ethylene carbonate group, and the sultone group is a norbornanesultone group.

8. The photoresist composition according to claim 1, wherein a content of the first structural unit in the polymer component is from 1 to 60 mol % based on a total amount of the polymer component.

9. The photoresist composition according to claim 1, wherein an amount of the compound is from 0.1 to 20 parts by mass based on 100 parts by mass of the polymer component.

10. The photoresist composition according to claim 1, wherein at least one of $R^4$ and $R^5$ comprises an oxygen atom.

11. The photoresist composition according to claim 1, wherein at least one of $R^4$ and $R^5$ is the alicyclic hydrocarbon group having 3 to 20 carbon atoms, the aromatic hydrocarbon group having 6 to 20 carbon atoms, or the heterocyclic group having 3 to 10 nucleus atoms.

12. The photoresist composition according to claim 1, wherein $R^4$ and $R^5$ taken together represent the heterocyclic group having 3 to 10 carbon atoms together with the carbon atom bonded to $R^4$ and $R^5$.

13. The photoresist composition according to claim 1, wherein a mass ratio of the compound to the acid generator in the photoresist composition from 0.2 to 2.

14. The photoresist composition according to claim 1, further comprising a fluorine-containing polymer.

15. A resist pattern-forming method comprising:
applying the photoresist composition according to claim 1 on a substrate such that the resist film is formed on the substrate;
exposing the resist film; and
developing the exposed resist film.

* * * * *